(12) United States Patent
Lee et al.

(10) Patent No.: US 12,462,755 B2
(45) Date of Patent: Nov. 4, 2025

(54) DISPLAY DEVICE

(71) Applicant: LG Display Co., Ltd., Seoul (KR)

(72) Inventors: Seunghee Lee, Seoul (KR); Yongmin Jeong, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/939,212

(22) Filed: Nov. 6, 2024

(65) Prior Publication Data

US 2025/0259596 A1 Aug. 14, 2025

(30) Foreign Application Priority Data

Feb. 14, 2024 (KR) .................. 10-2024-0021101

(51) Int. Cl.
*G09G 3/3233* (2016.01)
(52) U.S. Cl.
CPC ..... *G09G 3/3233* (2013.01); *G09G 2300/0819* (2013.01); *G09G 2300/0842* (2013.01); *G09G 2310/08* (2013.01); *G09G 2320/0223* (2013.01); *G09G 2320/0233* (2013.01); *G09G 2320/043* (2013.01); *G09G 2330/021* (2013.01)
(58) Field of Classification Search
CPC .................................................. G09G 3/3233
USPC ....................................................... 345/212
See application file for complete search history.

(56) References Cited

U.S. PATENT DOCUMENTS

2019/0130846 A1\* 5/2019 Chung ................ G09G 3/3233
2021/0074216 A1\* 3/2021 Kim .................... G09G 3/3291

FOREIGN PATENT DOCUMENTS

| KR | 10-2043980 B1 | 11/2019 |
| KR | 10-2022-0052747 A | 4/2022 |
| KR | 10-2023-0075010 A | 5/2023 |

\* cited by examiner

*Primary Examiner* — Calvin C Ma
(74) *Attorney, Agent, or Firm* — Birch, Stewart, Kolasch & Birch, LLP

(57) ABSTRACT

A display device can include a display panel having a plurality of pixels disposed therein. Each of the plurality of pixels includes a light-emitting element configured to emit light by a drive current, a driving transistor disposed between a first node and a third node and configured to control the drive current flowing through the light-emitting element from a first power line through which a first power voltage is provided to a second power line through which a second power voltage is provided, a first transistor connected between the third node and a second node, a second transistor connected between a data line and the first node and configured to apply a data voltage to the first node, and a third transistor connected between the first power line and the first node and configured to apply the first power voltage to the first node.

11 Claims, 13 Drawing Sheets

DISPLAY DEVICE

CROSS-REFERENCE TO RELATED APPLICATIONS

This application claims priority to Korean Patent Application No. 10-2024-0021101 filed on Feb. 14, 2024, in the Korean Intellectual Property Office, the entire contents of which is hereby expressly incorporated by reference into the present application.

BACKGROUND

Field

The present disclosure relates to a display device, and more particularly, to a display device capable of operating with low power consumption.

Discussion of the Related Art

With the advancement of technologies in the modern society, display devices are being used in various ways to provide information to users. The display devices can be included in electronic display boards, which simply transfer visual information in one direction, and also included in various high-technology electronic devices that identify user inputs and provide information in response to the identified inputs.

As the representative display devices, there can be a liquid crystal display device (LCD), a field emission display device (FED), an electrowetting display device (EWD), an organic light-emitting display device (OLED), and the like.

Among the display devices, an organic light-emitting display device refers to a display device that autonomously emits light. Unlike a liquid crystal display apparatus, the organic light-emitting display device does not require a separate light source and thus can be manufactured as a lightweight, thin display device.

In addition, the organic light-emitting display device is advantageous in terms of power consumption because the electroluminescent display device operates at a low voltage. Further, the organic light-emitting display device is expected to be adopted in various fields because the organic light-emitting display device is also excellent in implementation of colors, response speeds, viewing angles, and contrast ratios (CRs).

SUMMARY OF THE DISCLOSURE

An object to be achieved by the present disclosure is to provide a display device capable of compensating for a high-potential drive voltage without adding a separate line.

Another object to be achieved by the present disclosure is to provide a display device, in which display quality and lifespan are improved by minimizing a drop of a high-potential drive voltage.

Objects of the present disclosure are not limited to the above-mentioned objects, and other objects, which are not mentioned above, can be clearly understood by those skilled in the art from the following descriptions.

A display device according to an example embodiment of the present disclosure includes a display panel having a plurality of pixels disposed therein, where each of the plurality of pixels includes a light-emitting element configured to emit light by a drive current, a driving transistor disposed between a first node and a third node and configured to control the drive current flowing through the light-emitting element from a first power line through which a first power voltage is provided to a second power line through which a second power voltage is provided, a first transistor connected between the third node and a second node, a second transistor connected between a data line and the first node and configured to apply a data voltage to the first node, a third transistor connected between the first power line and the first node and configured to apply the first power voltage to the first node, a fourth transistor connected between the third node and a first electrode of the light-emitting element and configured to define a current path between the driving transistor and the light-emitting element, a fifth transistor connected between the second node and a third power line through which a third power voltage is provided and configured to apply the third power voltage to the second node, a sixth transistor connected between a fourth node and a fourth power line through which a fourth power voltage is provided and configured to apply the fourth power voltage to the fourth node, a seventh transistor connected between the first node and a fifth power line through which a fifth power voltage is provided and configured to apply the fifth power voltage to the first node, and a storage capacitor having a first electrode connected to the second node and a second electrode connected to a fifth node, wherein the fifth node is connected to the first power line and the fifth power line so that the first power voltage or the fifth power voltage is applied to the fifth node.

Other detailed matters of the example embodiments are included in the detailed description and the drawings.

According to aspects of the present disclosure, it is possible to minimize a drop of a high-potential drive voltage by applying an on-bias stress voltage before a period during which the light-emitting element emits light, thereby improving luminance uniformity and display quality of the large-area display device.

According to aspects of the present disclosure, an on-bias stress voltage can be applied to the storage capacitor, thereby compensating for a high-potential drive voltage without adding a separate line.

The effects according to the present disclosure are not limited to the contents exemplified above, and more various effects are included in the present disclosure.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
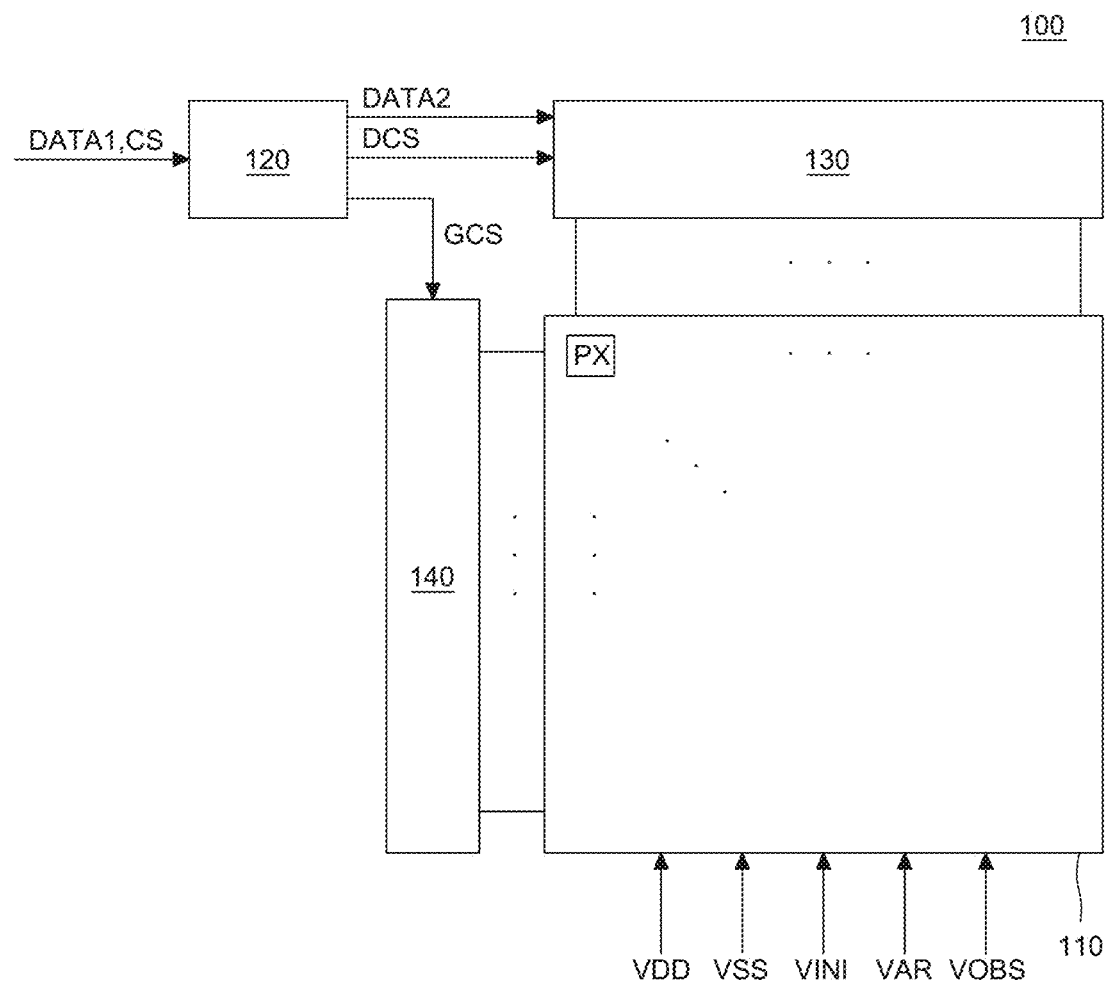
FIG. 1 is a functional block diagram of a display device according to an embodiment of the present disclosure.

Advantages and characteristics of the present disclosure and a method of achieving the advantages and characteristics will be clear by referring to example embodiments described below in detail together with the accompanying drawings. However, the present disclosure is not limited to the example embodiments disclosed herein but will be implemented in various forms. The example embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the example embodiments of the present disclosure are merely examples, and the present disclosure is not limited thereto. Like reference numerals generally denote like elements throughout the disclosure. Further, in the following description of the present disclosure, a detailed explanation of known related technologies can be omitted to avoid unnecessarily obscuring the subject matter of the present disclosure. The terms such as "including," "having," and "consist of" used herein are generally intended to allow other components to be added unless the terms are used with the term "only". Any references to singular can include plural unless expressly stated otherwise.

When the position relation between two parts is described using the terms such as "on", "above", "below", and "next", one or more parts can be positioned between the two parts unless the terms are used with the term "immediately" or "directly".

Although the terms "first", "second", and the like are used for describing various components, these components are not confined by these terms. These terms are merely used for distinguishing one component from the other components, and may not define order or sequence. Therefore, a first component to be mentioned below can be a second component in a technical concept of the present disclosure.

The features of various embodiments of the present disclosure can be partially or entirely adhered to or combined with each other and can be interlocked and operated in technically various ways, and the embodiments can be carried out independently of or in association with each other. Further, the term "can" fully encompasses all the meanings and coverages of the term "may."

Hereinafter, example embodiments of the present disclosure will be described in detail with reference to accompanying drawings. All the components of each display device according to all embodiments of the present disclosure are operatively coupled and configured.

FIG. 1 is a functional block diagram of a display device according to an embodiment of the present disclosure.

With reference to FIG. 1, a display device 100 according to an embodiment of the present disclosure includes a display panel 110, a timing controller 120, a data driver 130, and a gate driver 140.

A plurality of pixels PX can be disposed on the display panel 110 to display images.

A plurality of gate lines GL can be disposed in a first direction on the display panel 110, and a plurality of data lines DL can be disposed on the display panel 110 in a second direction different from the first direction. The plurality of gate lines GL and the plurality of data lines DL can intersect one another, and the plurality of pixels PX can be disposed in a matrix shape.

The plurality of pixels PX can be electrically connected to the plurality of gate lines GL and the plurality of data lines DL. Therefore, gate signals and data voltages can be supplied to the pixels PX through the gate lines GL and the data lines DL. The pixels PX implement gradation by means of the gate signals and the data voltages, such that images can be displayed on the display panel 110.

The plurality of pixels PX can each be any one of a red pixel, a green pixel, a blue pixel, and a white pixel. The red pixel, the green pixel, the blue pixel, and the white pixel can constitute one unit pixel to implement colors. The color implemented by the unit pixel can be determined depending on light emission ratios between the red pixel, the green pixel, the blue pixel, and the white pixel. Meanwhile, the white pixel can be excluded from the unit pixel. One data line DL and one gate line GL can be connected to each of the plurality of pixels PX.

The plurality of pixels PX can each include a driving transistor and a plurality of switching transistors. The plurality of pixels PX can be supplied with a first power voltage VDD (e.g., a high-potential drive voltage), a second power voltage VSS (e.g., a low-potential drive voltage), a third power voltage VINI (e.g., a first initialization voltage), a fourth power voltage VAR (e.g., a second initialization voltage), and a fifth power voltage VOBS (e.g., an on-bias stress voltage).

A voltage level of the second power voltage VSS can be lower than a voltage level of the first power voltage VDD. For example, the first power voltage VDD can be a positive voltage, and the second power voltage VSS can be a negative voltage.

The third power voltage *VINI* and the fourth power voltage VAR are initialization voltages for initializing the pixel PX. For example, the driving transistor and/or a light-emitting element included in the pixel PX can be initialized by the initialization voltage.

The fifth power voltage VOBS can be a voltage for supplying a predetermined bias to a source electrode and/or a drain electrode of the driving transistor included in the pixel PX. For example, the fifth power voltage VOBS can be a positive voltage. However, the voltage level of the fifth power voltage VOBS is not limited thereto. The fifth power voltage VOBS can be set to a negative voltage.

In the embodiment of the present disclosure, the signal lines connected to the pixel PX can be variously set while corresponding to a circuit structure of the pixel PX.

The timing controller 120 can be supplied with first data DATA1 and an input control signal CS from a host system, such as an application processor (AP), through a predetermined interface. The timing controller 120 can control operation timings of the data driver 130 and the gate driver 140.

The timing controller 120 can generate a gate control signal GCS and a data control signal DCS on the basis of the first data DATA1 and the input control signal CS. For example, the input control signal CS can include a vertical synchronizing signal, a horizontal synchronizing signal, a data enable signal, a clock signal, and the like. The gate control signal GCS can be supplied to the gate driver 140, and the data control signal DCS can be supplied to the data driver 130. The timing controller 120 can generate second data DATA2 by realigning the first data DATA1 and supply the second data DATA2 to the data driver 130.

The data driver 130 can receive the data control signal DCS and the second data DATA2 from the timing controller 120. The data driver 130 can convert the digital-type second data DATA2 into an analog data signal. The data driver 130 can supply data signals to the plurality of data lines DL in response to the data control signal DCS. In this case, the data signal supplied to the plurality of data lines DL can be supplied to be synchronized with the gate signal supplied to the plurality of gate lines GL.

The data driver 130 can be connected to a bonding pad of the display panel 110 in a chip-on-glass (COG) manner or disposed directly on the display panel 110. In some instances, the data driver 130 can be integrated on the display panel 110. In addition, the data driver 130 can be disposed in a chip-on-film (COF) manner.

The gate driver 140 can generate the scan signal and the light emission signal on the basis of the gate control signal GCS. The gate driver 140 can include a scan driver and a light emission signal driver.

The scan driver can generate scan signals in a row-sequential manner to operate at least one scan line connected to each pixel row and supply the scan signals to scan lines. For example, the scan driver can supply a first scan signal, a second scan signal, a third scan signal, and a fourth scan signal. The first to fourth scan signals can be set to gate-on voltages corresponding to the types of transistors to which the corresponding scan signals are supplied. The transistor, which receives the scan signal, can be set to a turn-on state when the scan signal is supplied. For example, a gate-on voltage of a scan signal supplied to a P-channel metal oxide semiconductor (PMOS) transistor can be a low logic level, and a gate-on voltage of a scan signal supplied to an N-channel metal oxide semiconductor (NMOS) transistor can be a high logic level. Hereinafter, the configuration in which the "scan signal is supplied" can be understood to mean that the scan signal is supplied at a logic level that turns on the transistor controlled by the scan signal.

The light emission signal driver can generate light emission signals in a row-sequential manner to operate at least one light-emitting line connected to each pixel row and supply the light emission signals to light-emitting lines.

The light emission signal can be set to a gate-off voltage. The transistor, which receives the light emission signal, can be turned off when the light emission signal is supplied, and the transistor can be set to a turn-on state in the other cases. Hereinafter, the configuration in which the "light emission signal is supplied" can be understood to mean that the light emission signal is supplied at a logic level that turns off the transistor controlled by the light emission signal.

Hereinafter, a configuration of the plurality of pixels PX will be specifically described.

Figure 2:
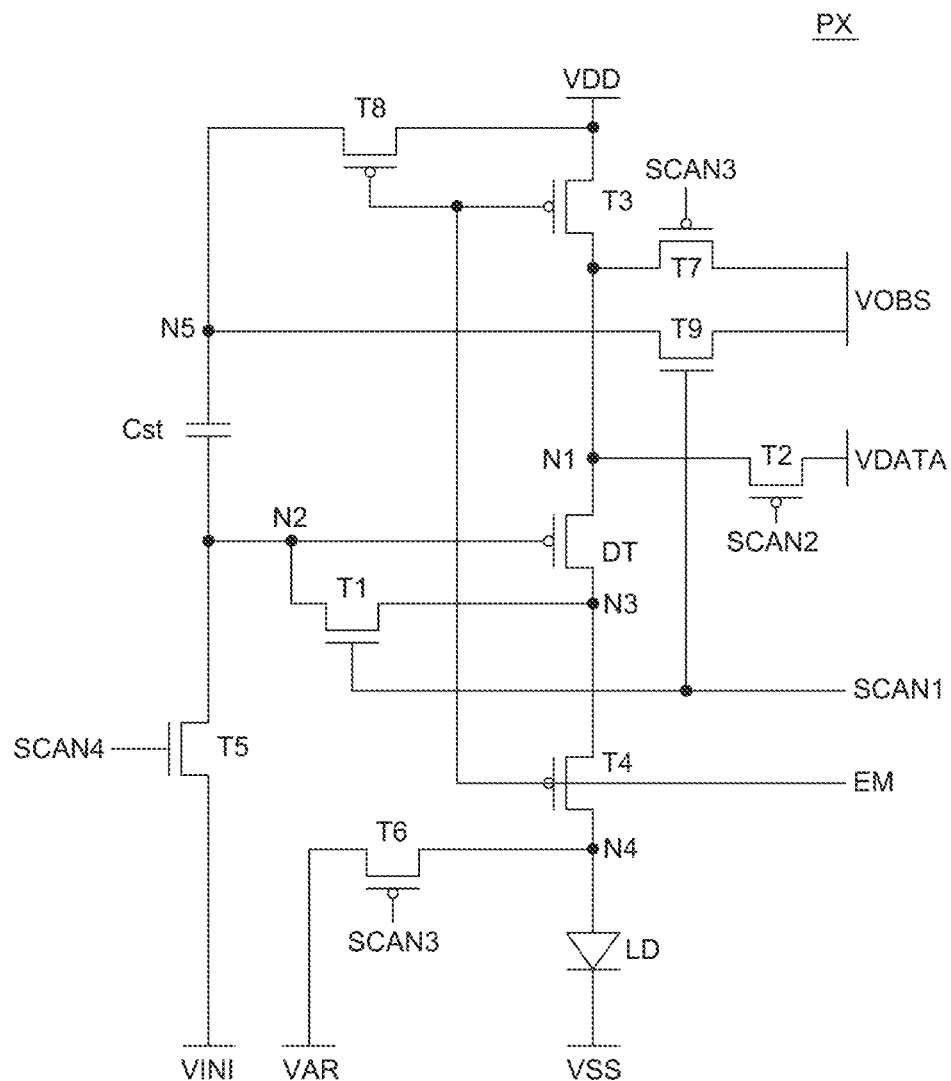
FIG. 2 is an example circuit diagram of a pixel of the display device according to the embodiment of the present disclosure.

FIG. 2 is an example circuit diagram of the pixel of the display device according to the embodiment of the present disclosure.

With reference to FIG. 2, the pixel PX can include a light-emitting element LD, first to tenth transistors DT, T1, T2, T3, T4, T5, T6, T7, T8, and T9, and a storage capacitor Cst.

A first electrode (e.g., an anode electrode) of the light-emitting element LD can be connected to a fourth node N4, and a second electrode (e.g., a cathode electrode) of the light-emitting element LD can be connected to a second power line configured to transmit the second power voltage VSS. The light-emitting element LD can generate light with predetermined luminance in response to the amount of current (drive current) supplied from a driving transistor DT. The second power line can have a line shape. However, the present disclosure is not limited thereto. For example, the second power line can be a conductive layer having a conductive plate shape.

In the embodiment of the present disclosure, the light-emitting element LD can be an organic light-emitting diode including an organic light-emitting layer. In another embodiment, the light-emitting element LD can be an inorganic light-emitting diode made of an inorganic material, like a micro light-emitting diode (LED), a quantum dot light-emitting diode, and the like. In another embodiment, the light-emitting element LD can be a light-emitting element in which an organic material and an inorganic material are complexly configured.

Meanwhile, FIG. 2 illustrates that the pixel PX includes the single light-emitting element LD. However, in another embodiment, the pixel PX can include a plurality of light-emitting elements, and the plurality of light-emitting elements can be connected in series, parallel, or both series and parallel. For example, the light-emitting elements LD can define a shape in which the plurality of light-emitting elements (e.g., the organic light-emitting elements and/or the inorganic light-emitting elements) are connected in series, parallel, or both series and parallel between the second power line and the fourth node N4.

The driving transistor DT controls a drive current to be supplied to a light-emitting element LD in response to a source-gate voltage Vsg. The driving transistor DT can be connected between a first node N1 and a third node N3. For example, a first electrode (e.g., a source electrode) of the driving transistor DT can be connected to the first node N1, and a second electrode (e.g., a drain electrode) of the driving transistor DT can be connected to the fourth node N4. In addition, a gate electrode of the driving transistor DT can be connected to a second node N2. The driving transistor DT can control a drive current flowing from a first power line, which provides the first power voltage VDD in response to a voltage of the second node N2, i.e., a voltage of the gate electrode, to the second power line, which provides the second power voltage VSS, through the light-emitting element LD. To this end, the first power voltage VDD can be set to a voltage higher than the second power voltage VSS.

For example, the first power voltage VDD can be a positive voltage, and the second power voltage VSS can be a negative voltage.

A first transistor T1 diode-connects the gate electrode and the drain electrode of the driving transistor DT. The first transistor T1 can be connected between the second node N2 and the third node N3. For example, a first electrode (e.g., a source electrode) of the first transistor T1 can be connected to the third node N3, and a second electrode (e.g., a drain electrode) of the first transistor T1 can be connected to the second node N2. In addition, a gate electrode of the first transistor T1 can be connected to a first scan line through which a first scan signal SCAN1 is supplied. When the first scan signal SCAN1 is supplied to the first scan line, the first transistor T1 can be turned on and electrically connect the second electrode and the gate electrode of the driving transistor DT. For example, it is possible to control a timing of when the second electrode and the gate electrode of the driving transistor DT are connected by the first scan signal SCAN1. When the first transistor T1 is turned on, the gate electrode and the drain electrode of the driving transistor DT can be diode-connected in a diode shape.

A second transistor T2 supplies a data voltage VDATA, which is supplied from the data line DL, to the first node N1 that is the source electrode of the driving transistor DT. The second transistor T2 can be connected between the first node N1 and the data line DL through which the data voltage VDATA is supplied. For example, a first electrode (e.g., a source electrode) of the second transistor T2 can be connected to the data line DL, and a second electrode (e.g., a drain electrode) of the second transistor T2 can be connected to the first node N1. In addition, a gate electrode of the second transistor T2 can be connected to a second scan line through which a second scan signal SCAN2 is supplied. When the second scan signal SCAN2 is supplied to the second scan line, the second transistor T2 can be turned on and electrically connect the data line and the first node N1.

A third transistor T3 supplies the first power voltage VDD to the first node N1 that is the source electrode of the driving transistor DT. The third transistor T3 can be connected between the first node N1 and the first power line through which the first power voltage VDD is supplied. For example, a first electrode (e.g., a source electrode) of the third transistor T3 can be connected to the first power line, and a second electrode (e.g., a drain electrode) of the third transistor T3 can be connected to the first node N1. In addition, a gate electrode of the third transistor T3 can be connected to a light-emitting line through which a light emission signal EM is supplied. When the light emission signal is supplied to the light-emitting line, the third transistor T3 can be turned on. When the third transistor T3 is turned on, the first node N1 can be electrically connected to the first power line, such that the first power voltage can be applied to the first node N1.

A fourth transistor T4 defines a current path between the driving transistor DT and the light-emitting element LD. The fourth transistor T4 can be connected between the third node N3 and the fourth node N4. The fourth transistor T4 can be connected between the second electrode of the driving transistor DT and the first electrode of the light-emitting element LD. For example, a first electrode (e.g., a source electrode) of the fourth transistor T4 can be connected to the third node N3, and a second electrode (e.g., a drain electrode) of the fourth transistor T4 can be connected to the fourth node N4. In addition, a gate electrode of the fourth transistor T4 can be connected to the light-emitting line. When the fourth transistor T4 is turned on, the third node N3 and the fourth node N4 can be electrically connected.

A fifth transistor T5 applies an initialization voltage VINI to the second node N2 that is the gate electrode of the driving transistor DT. The fifth transistor T5 can be connected between the second node N2 and a third power line through which the third power voltage VINI (hereinafter, referred to as a "first initialization voltage") is provided. For example, a first electrode (e.g., a source electrode) of the fifth transistor T5 can be connected to the third power line, and a second electrode (e.g., a drain electrode) of the fifth transistor T5 can be connected to the second node N2. In addition, a gate electrode of the fifth transistor T5 can be connected to a fourth scan line through which a fourth scan signal SCAN4 is supplied. When the fourth scan signal SCAN4 is supplied to the fourth scan line, the fifth transistor T5 can be turned on and supply the first initialization voltage VINI to the second node N2. In this case, the first initialization voltage VINI can be set to a voltage lower than a lowest level of the data voltage VDATA supplied to the data line DL.

The fifth transistor T5 is turned on by the supply of the fourth scan signal SCAN4, such that the voltage of the gate electrode of the driving transistor DT can be initialized to the first initialization voltage VINI.

A sixth transistor T6 applies the fourth power voltage VAR to the fourth node N4 that is an anode of the light-emitting element LD. The sixth transistor T6 can be connected between the first electrode of the light-emitting element LD and a fourth power line through which the fourth power voltage VAR (hereinafter, referred to as a "second initialization voltage") is provided. For example, a first electrode (e.g., a source electrode) of the sixth transistor T6 can be connected to the fourth power line, and a second electrode (e.g., a drain electrode) of the sixth transistor T6 can be connected to the fourth node N4. In addition, a gate electrode of the sixth transistor T6 can be connected to a third scan line through which a third scan signal SCAN3 is supplied. When the third scan signal SCAN3 is supplied to the third scan line, the sixth transistor T6 can be turned on and supply a second initialization voltage VAR to the fourth node N4.

In the embodiment, in case that the third scan signal SCAN3 is supplied, the second initialization voltage VAR can be supplied to the first electrode of the light-emitting element LD by the turned-on sixth transistor T6. In this case, a parasitic capacitor of the light-emitting element LD can be discharged. As described above, a residual voltage, with which the parasitic capacitor of the light-emitting element LD is charged, is discharged, such that inadvertent fine light emission can be prevented. Therefore, a black representation ability of the pixel PX can be improved.

Meanwhile, a voltage level of the first initialization voltage VINI and a voltage level of the second initialization voltage VAR can be different voltage levels. For example, a voltage for initializing the second node N2 and a voltage for initializing the fourth node N4 can be differently set.

In case that the first initialization voltage VINI supplied to the second node N2 is excessively low in a low-frequency operation in which a length of one frame period increases, an intensive on-bias can be applied to the driving transistor DT, a threshold voltage of the driving transistor DT in the corresponding frame period can be shifted. This hysteresis characteristics can cause a flicker phenomenon during the low-frequency operation. Therefore, in the low-frequency operation, the display device can require the first initialization voltage VINI higher than the second power voltage VSS.

However, in case that the voltage level of the second initialization voltage VAR, which is supplied to the fourth node N4 to initialize the light-emitting element LD, becomes higher than a predetermined reference level, the voltage of the parasitic capacitor of the light-emitting element LD is not discharged, but the parasitic capacitor can be charged with the voltage. Therefore, the voltage level of the second initialization voltage VAR needs to be sufficiently low to the extent that the voltage of the parasitic capacitor of the light-emitting element LD can be discharged. For example, in consideration of the threshold voltage of the light-emitting element LD, the voltage level of the second initialization voltage VAR can be set so that the voltage level of the second initialization voltage VAR is lower than a sum of the threshold voltage of the light-emitting element LD and the second power voltage VSS.

However, this is provided for illustrative purposes only. The voltage level of the first initialization voltage VINI and the voltage level of the second initialization voltage VAR can be variously set. For example, the voltage level of the first initialization voltage VINI and the voltage level of the second initialization voltage VAR can be substantially equal to each other.

A seventh transistor T7 can apply the fifth power voltage VOBS to the first node N1 that is the source electrode of the driving transistor DT. The seventh transistor T7 can be connected between the first node N1 and a fifth power line through which the fifth power voltage VOBS (hereinafter, referred to as an "on-bias stress voltage") is provided. For example, a first electrode (e.g., a source electrode) of the seventh transistor T7 can be connected to the fifth power line, and a second electrode (e.g., a drain electrode) of the seventh transistor T7 can be connected to the first node N1. In addition, a gate electrode of the seventh transistor T7 can be connected to the third scan line through which the third scan signal SCAN3 is supplied.

When the third scan signal SCAN3 is supplied to the third scan line, the seventh transistor T7 can be turned on and supply the on-bias stress voltage VOBS to the first node N1. In the embodiment, the on-bias stress voltage VOBS can have a level similar to the voltage level of the data voltage VDATA with the black gradation. In addition, the on-bias stress voltage VOBS can be equal to or higher than the first power voltage VDD. For example, the on-bias stress voltage VOBS can have a voltage level of about 5 to 7 V, and the first power voltage VDD can have a voltage level of 2 to 4 V. However, this is provided for illustrative purposes only, and the voltage level of the on-bias stress voltage VOBS is not limited thereto.

Therefore, as the seventh transistor T7 is turned on, a predetermined high voltage can be applied to the first electrode (e.g., the source electrode) of the driving transistor DT. In this case, when the second transistor T2 is in a turn-off state, the driving transistor DT can be in an on-bias state (in a state in which the driving transistor DT can be turned on).

In this case, as the on-bias stress voltage VOBS is periodically supplied to the first node N1, the bias state of the driving transistor DT can be periodically changed, and the threshold voltage characteristics of the driving transistor DT can be changed. Therefore, it is possible to prevent a situation in which the characteristics of the driving transistor DT are fixed in a particular state and degraded in the low-frequency operation.

The storage capacitor Cst can store the voltage applied to the second node N2. The storage capacitor Cst can be connected between a fifth node N5 and the second node N2. The fifth node N5 can be connected to the first power line and the fifth power line. As a first electrode of the storage capacitor Cst is connected to the first power line and the fifth power line, the first power voltage VDD or the on-bias stress voltage VOBS, which is a constant voltage, can be supplied to the first electrode of the storage capacitor Cst. Therefore, the voltage of the fifth node N5 can be maintained at a voltage level, i.e., a level of a voltage supplied directly to the fifth node N5 without being affected by other parasitic capacitors. For example, the storage capacitor Cst can store the voltage applied to the fifth node N5.

An eighth transistor T8 applies the first power voltage VDD to the fifth node N5. The eighth transistor T8 can be connected between the fifth node N5 and a first power voltage line through which the first power voltage VDD is provided. For example, a first electrode (e.g., a source electrode) of the eighth transistor T8 can be connected to the first power line, and a second electrode (e.g., a drain electrode) of the eighth transistor T8 can be connected to the fifth node N5. In addition, a gate electrode of the eighth transistor T8 can be connected to the light-emitting line through which the light emission signal EM is supplied.

The eighth transistor T8 can be turned on when the light emission signal is supplied to the light-emitting line. When the eighth transistor T8 is turned on, the fifth node N5 can be electrically connected to the first power line, such that the first power voltage can be applied to the fifth node N5.

The eighth transistor T8 can be controlled in substantially the same way as the third transistor T3 and the fourth transistor T4.

FIG. 2 illustrates that the eighth transistor T8, the third transistor T3, and the fourth transistor T4 can be connected to the same light-emitting line. However, this is provided for illustrative purposes only, and the present disclosure is not limited thereto. For example, the eighth transistor T8, the third transistor T3, and the fourth transistor T4 can be respectively connected to separate light-emitting lines through which different light emission signals are supplied.

A ninth transistor T9 applies the on-bias stress voltage VOBS to the fifth node N5. The ninth transistor T9 can be connected between the fifth node N5 and the fifth power line through which the on-bias stress voltage VOBS is provided. For example, a first electrode (e.g., a source electrode) of the ninth transistor T9 can be connected to the fifth power line, and a second electrode (e.g., a drain electrode) of the ninth transistor T9 can be connected to the fifth node N5. In addition, a gate electrode of the ninth transistor T9 can be connected to the first scan line through which the first scan signal SCAN1 is supplied.

When the first scan signal SCAN1 is supplied to the first scan line, the ninth transistor T9 can be turned on. When the ninth transistor T9 is turned on, the fifth node N5 can be electrically connected to the fifth power line, such that the fifth power voltage can be applied to the fifth node N5.

The ninth transistor T9 can be controlled in substantially the same way as the first transistor T1.

FIG. 2 illustrates that the ninth transistor T9 and the first transistor T1 are connected to the same first scan line. However, this is provided for illustrative purposes only, and the present disclosure is not limited thereto. For example, the ninth transistor T9 and the first transistor T1 can be respectively connected to separate first scan lines through which the different first scan signals SCAN1 are supplied.

Meanwhile, the driving transistor DT, the second transistor T2, the third transistor T3, the fourth transistor T4, the sixth transistor T6, the seventh transistor T7, and the eighth transistor T8 can each be configured as a polysilicon semiconductor transistor. For example, the driving transistor DT, the second transistor T2, the third transistor T3, the fourth transistor T4, the sixth transistor T6, the seventh transistor T7, and the eighth transistor T8 can include a polysilicon semiconductor layer that is an active layer formed through a low-temperature poly-silicon (LTPS) process. In addition, the driving transistor DT, the second transistor T2, the third transistor T3, the fourth transistor T4, the sixth transistor T6, the seventh transistor T7, and the eighth transistor T8 can each be a P-type transistor (e.g., a PMOS transistor). Therefore, the gate-on voltage for turning on the driving transistor DT, the second transistor T2, the third transistor T3, the fourth transistor T4, the sixth transistor T6, the seventh transistor T7, and the eighth transistor T8 can be at a low logic level.

Because the polysilicon semiconductor transistor advantageously has a high response speed, the polysilicon semiconductor transistor can be applied to a switching element that requires quick switching.

The first transistor T1, the fifth transistor T5, and the ninth transistor T9 can be configured as an oxide semiconductor transistor. For example, the first transistor T1, the fifth transistor T5, and the ninth transistor T9 can each be an N-type oxide semiconductor transistor (e.g., an NMOS transistor) and include an oxide semiconductor layer as an active layer. Therefore, the gate-on voltage for turning on the first transistor T1, the fifth transistor T5, and the ninth transistor T9 can be at a high logic level.

The oxide semiconductor transistor can perform a low-temperature process and have lower charge mobility than the polysilicon semiconductor transistor. For example, the oxide semiconductor transistor has excellent current characteristics. Therefore, in case that the first transistor T1, the fifth transistor T5, and the ninth transistor T9 are each configured as an oxide semiconductor transistor, it is possible to minimize a leakage current from the third node N3 in accordance with a low-frequency operation, thereby improving the display quality. However, the present disclosure is not limited thereto. At least one of the driving transistor DT, the second transistor T2, the third transistor T3, the fourth transistor T4, the sixth transistor T6, the seventh transistor T7, and the eighth transistor T8 can be configured as an oxide semiconductor transistor. Alternatively, at least one of the first transistor T1, the fifth transistor T5, and the seventh transistor T7 can be configured as a polysilicon semiconductor transistor.

Figure 3:
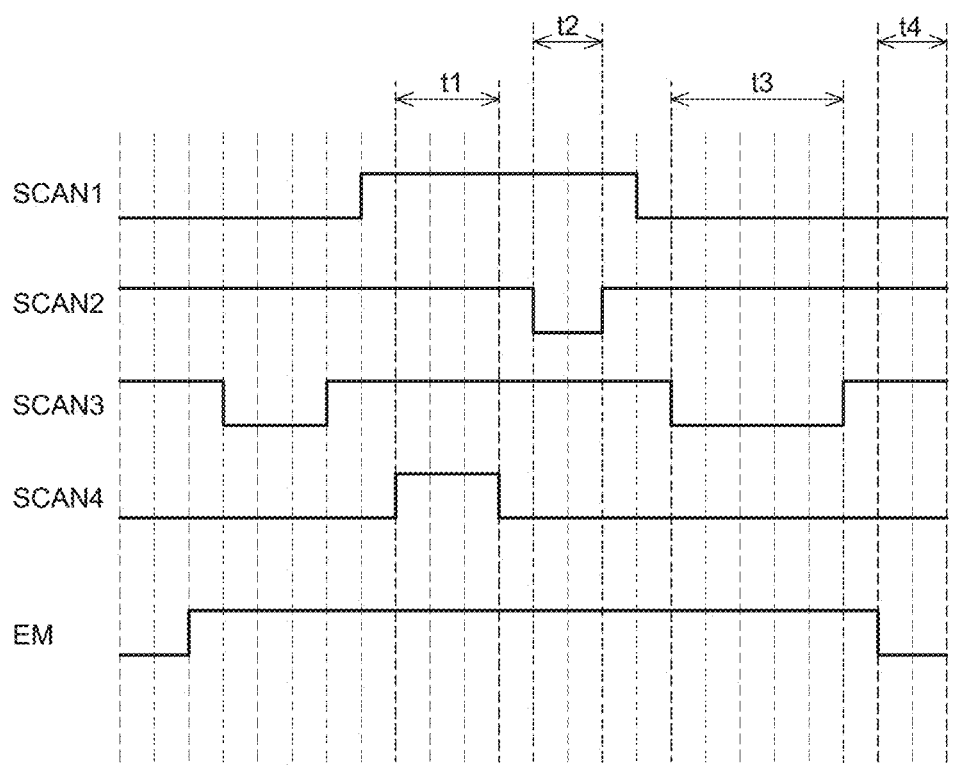
FIG. 3 is a waveform diagram illustrating a light emission signal and a scan signal of the display device according to the embodiment of the present disclosure during a refresh frame.
Figure 4:
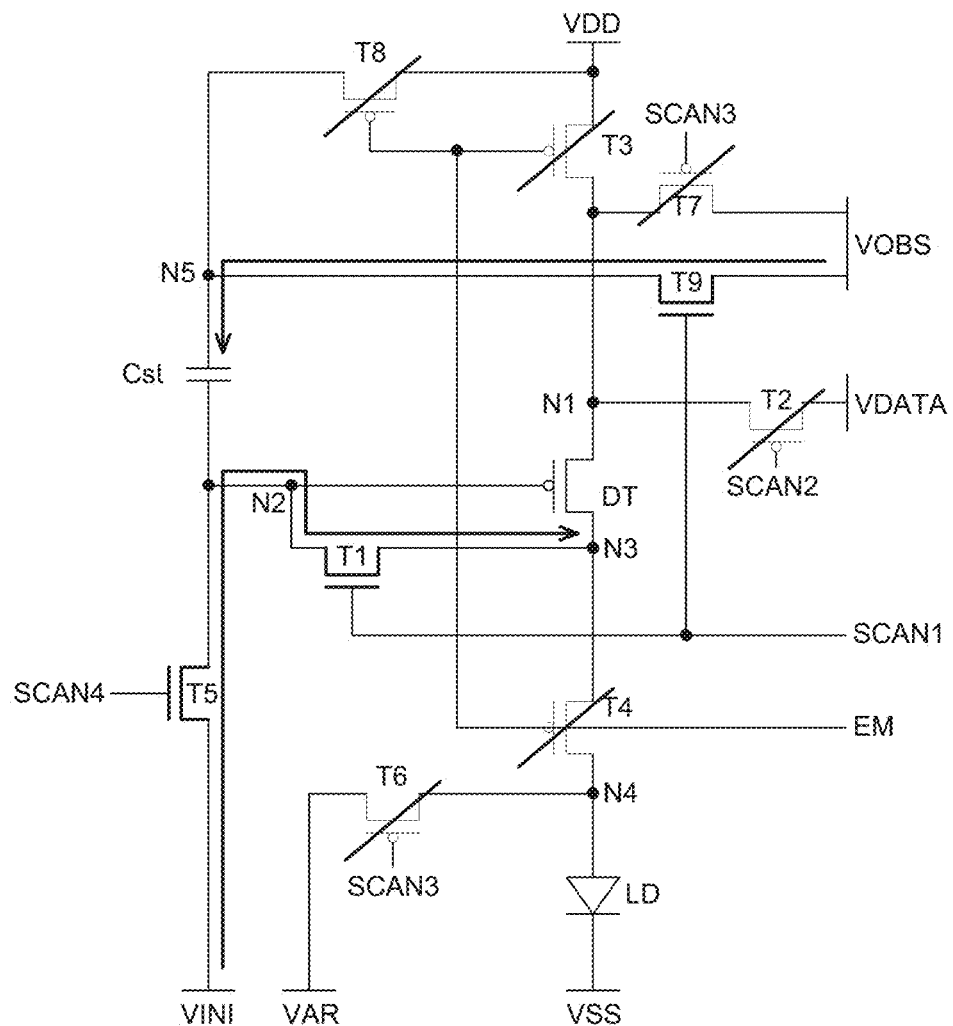
FIG. 4 is a circuit diagram illustrating an operation of a pixel circuit of the display device according to the embodiment of the present disclosure during a first period.
Figure 5:
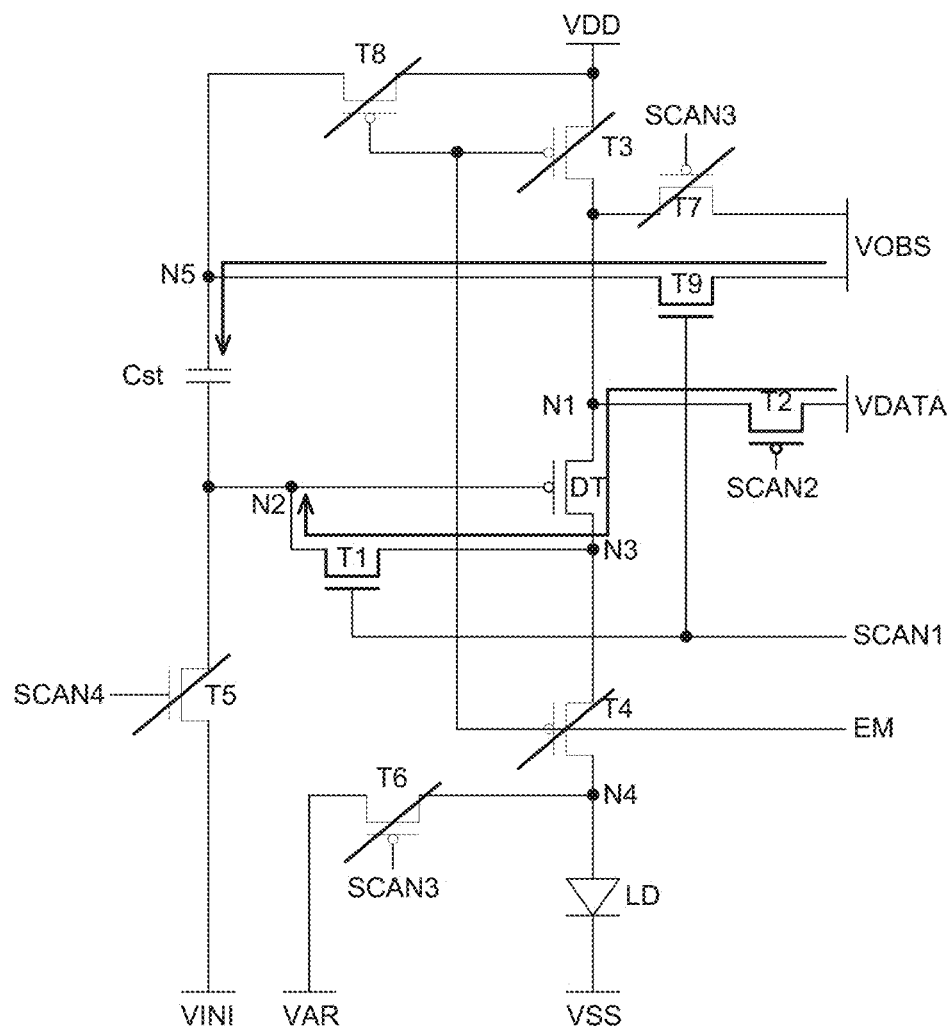
FIG. 5 is a circuit diagram illustrating an operation of the pixel circuit of the display device according to the embodiment of the present disclosure during a second period.
Figure 6:
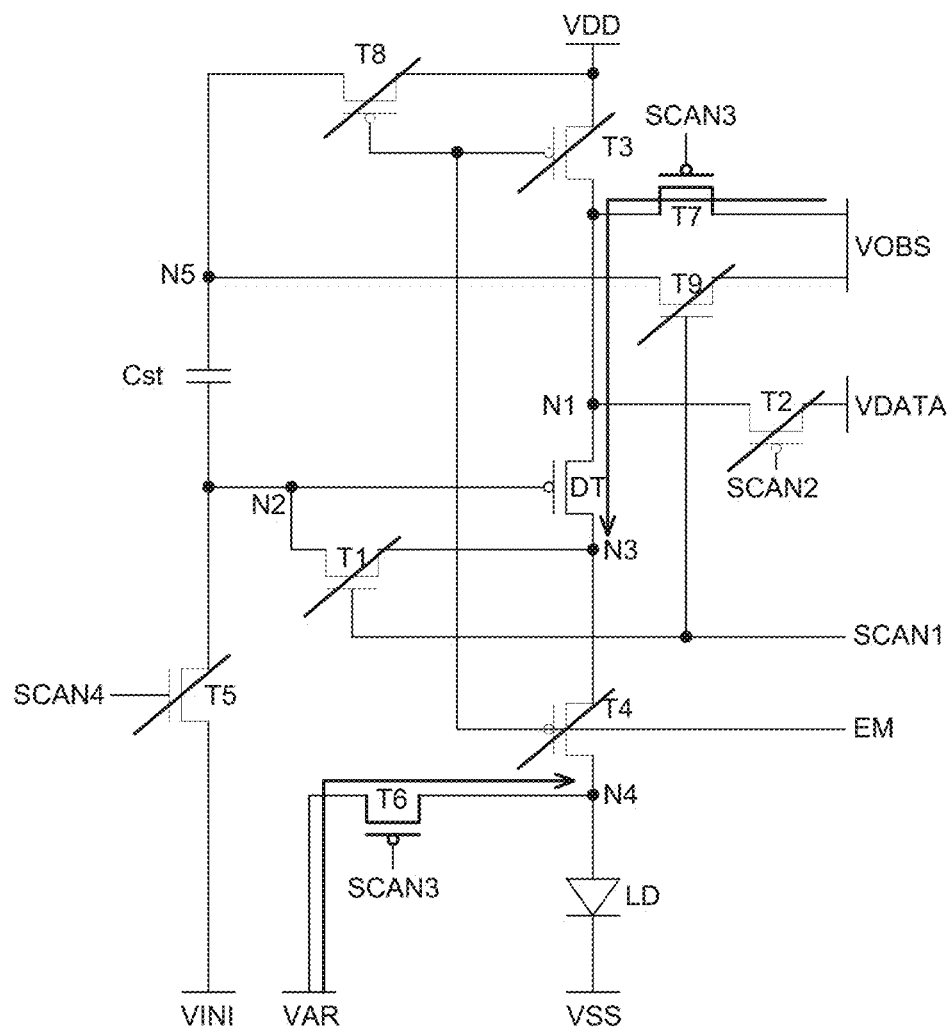
FIG. 6 is a circuit diagram illustrating an operation of the pixel circuit of the display device according to the embodiment of the present disclosure during a third period.
Figure 7:
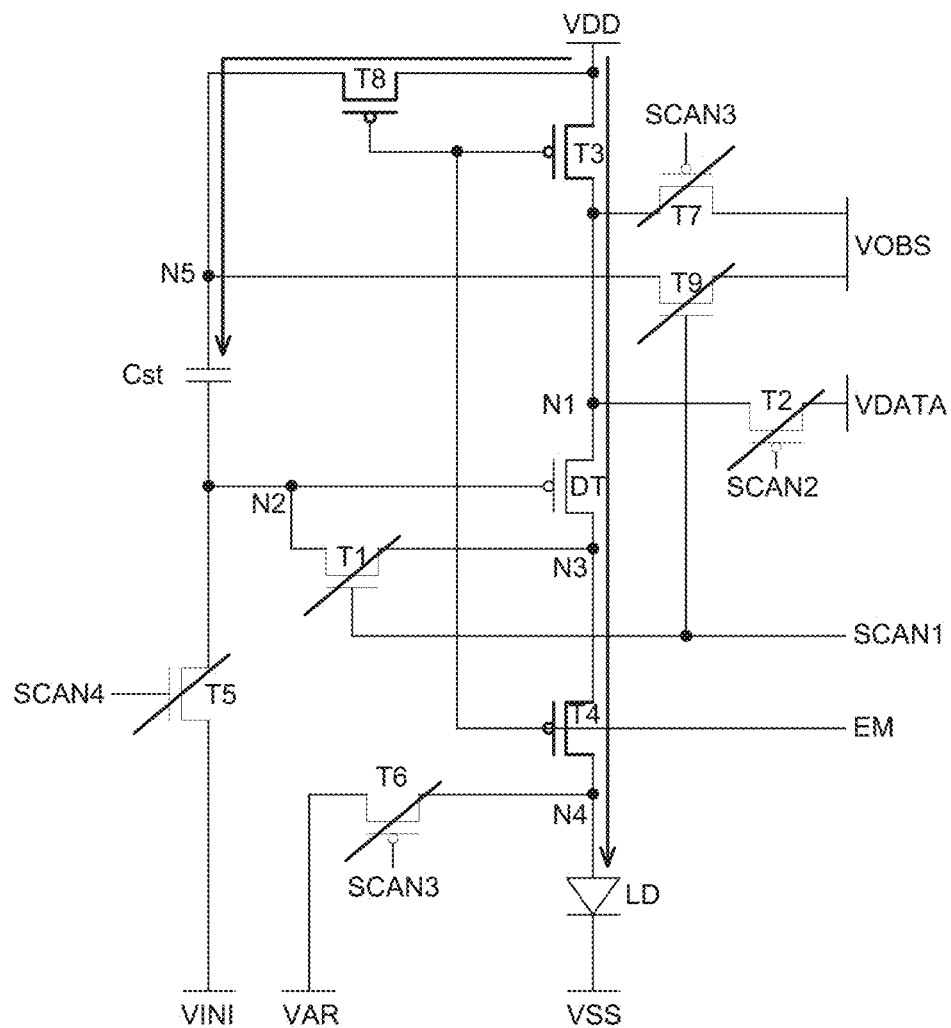
FIG. 7 is a circuit diagram illustrating an operation of the pixel circuit of the display device according to the embodiment of the present disclosure during a fourth period.

FIG. 3 is a waveform diagram illustrating a light emission signal and a scan signal of the display device according to the embodiment of the present disclosure during a refresh frame. FIG. 4 is a circuit diagram illustrating an operation of a pixel circuit of the display device according to the embodiment of the present disclosure during a first period. FIG. 5 is a circuit diagram illustrating an operation of the pixel circuit of the display device according to the embodiment of the present disclosure during a second period. FIG. 6 is a circuit diagram illustrating an operation of the pixel circuit of the display device according to the embodiment of the present disclosure during a third period. FIG. 7 is a circuit diagram illustrating an operation of the pixel circuit of the display device according to the embodiment of the present disclosure during a fourth period.

The display device according to the embodiment of the present disclosure can operate with frames divided into a refresh frame and a reset frame.

In the refresh frame, the data voltage VDATA is programmed in each of the pixels PX, and the light-emitting element LD emits light. Further, the reset frame can be a vertical blank frame. The anode of the light-emitting element LD is reset during the reset frame.

In the display device according to the embodiment of the present disclosure, the refresh frame can be divided into a first period t1 (hereinafter, referred to as an "initial period"), a second period t2 (hereinafter, referred to as a "sampling period"), a third period t3 (hereinafter, referred to as an "on-bias stress period"), and a fourth period t4 (hereinafter, referred to as an "emission period"). The initial period t1 is a period during which the voltage of the third node N3, which is the drain electrode of the driving transistor DT, is initialized. The sampling period t2 is a period for which a threshold voltage Vth of the driving transistor DT is sampled, and the data voltage VDATA is programmed. The on-bias stress period t3 is a period during which the on-bias stress is applied to the first node N1 that is the source electrode of the driving transistor DT. The emission period t4 is a period during which the light-emitting element LD emits light in response to the drive current by the programmed source-gate voltage of the driving transistor DT.

With reference to FIGS. 3 and 4, the first scan signal SCAN1 and the fourth scan signal SCAN4 are at high levels that are turn-on levels during the initial period t1. Therefore, the first transistor T1 and the fifth transistor T5 are turned on, such that the first initialization voltage VINI is applied to the second node N2 and the third node N3. As a result, the gate electrode and the drain electrode of the driving transistor DT can be initialized to the first initialization voltage VINI.

Further, during the initial period t1, the ninth transistor T9 is turned on, the on-bias stress voltage VOBS is applied to the fifth node N5.

In addition, the second transistor T2, the third transistor T3, the fourth transistor T4, the sixth transistor T6, the seventh transistor T7, and the eighth transistor T8 are turned off during the initial period t1 because the second scan signal SCAN2 and the third scan signal SCAN3 are at high levels, i.e., turn-off levels.

With reference to FIGS. 3 and 5, during the sampling period t2, the first scan signal SCAN1 is at the high level, i.e., the turn-on level, and the second scan signal SCAN2 is at the low level, i.e., the turn-on level. Therefore, the second transistor T2 is turned on, such that the data voltage VDATA is applied to the first node N1. Further, as the first transistor T1 is also turned on, the driving transistor DT is diode-connected, and the gate electrode and the drain electrode of the driving transistor DT are short-circuited, such that the driving transistor DT operates like a diode.

In addition, the third transistor T3, the fourth transistor T4, the fifth transistor T5, the sixth transistor T6, the seventh transistor T7, and the eighth transistor T8 are turned off during the sampling period t2 because the third scan signal SCAN3 is at the high level, i.e., the turn-off level, and the fourth scan signal SCAN4 is at the low level, i.e., the turn-off level.

A current Ids flows between the source and the drain of the driving transistor DT during the sampling period t2. Because the gate electrode and the drain electrode of the driving transistor DT are in the diode-connected state, the voltage of the second node N2 is increased by the current flowing from the source electrode to the drain electrode until a gate-source voltage Vgs of the driving transistor DT becomes equal to the threshold voltage Vth. During the sampling period t2, the voltage of the second node N2 is charged as a voltage (VDATA-|Vth|) corresponding to a value made by subtracting the threshold voltage Vth of the driving transistor DT from the data voltage VDATA.

Further, during the sampling period t3, the ninth transistor T9 is maintained in the turn-on state, and the on-bias stress voltage VOBS is applied to the fifth node N5.

With reference to FIGS. 3 and 6, during the on-bias stress period t3, the third scan signal SCAN3 is at the low level, i.e., the turn-on level. Therefore, the sixth transistor T6 is turned on, such that the second initialization voltage VAR is applied to the fourth node N4. For example, the anode electrode of the light-emitting element LD is initialized to the second initialization voltage VAR.

Further, the seventh transistor T7 is turned on, such that the on-bias stress voltage VOBS is applied to the first node N1. For example, the gate-source voltage Vgs of the driving transistor DT can be decreased by applying bias stress to the first node N1, which is the source electrode of the driving transistor DT, during the on-bias stress period t3. Therefore, the source-drain current Ids of the driving transistor DT flows during the on-bias stress period t3, which can mitigate the hysteresis of the driving transistor DT.

In addition, the first transistor T1, the second transistor T2, the third transistor T3, the fourth transistor T4, the fifth transistor T5, the eighth transistor T8, and the ninth transistor T9 are turned off during the on-bias stress period t3 because the first scan signal SCAN1 is at the low level, i.e., the turn-off level, the second scan signal SCAN2 is at the high level, i.e., the turn-off level, and the fourth scan signal SCAN4 is at the low level, i.e., the turn-off level.

During the on-bias stress period t3, the first transistor T1 is turned off, such that the voltage of the second node N2 floats in a state of a voltage (VDATA-|Vth|) corresponding to a value made by subtracting the threshold voltage Vth of the driving transistor DT from the data voltage VDATA. In addition, the ninth transistor T9 is turned off, such that the voltage of the fifth node N5 floats in the state in which the on-bias stress voltage VOBS is applied.

With reference to FIGS. 3 and 7, during the emission period t4, the light emission signal EM is at the low level, i.e., the turn-on level. Therefore, the third transistor T3 is turned on, such that the first power voltage VDD, which is a high-potential drive voltage, is applied to the first node N1. Further, the eighth transistor T8 is turned on, such that the first power voltage VDD is applied to the fifth node N5. For example, the voltage of the fifth node N5 changes from the on-bias stress voltage VOBS to the high-potential drive voltage VDD.

In addition, the first transistor T1, the second transistor T2, the fifth transistor T5, the sixth transistor T6, the seventh transistor T7, and the ninth transistor T9 are turned off during the emission period t4 because the first scan signal SCAN1 is at the low level, i.e., the turn-off level, the second scan signal SCAN2 is at the high level, i.e., the turn-off level, the third scan signal SCAN3 is at the high level, i.e., the turn-off level, and the fourth scan signal SCAN4 is at the low level, i.e., the turn-off level.

During the emission period t4, the amount of change in voltage (VDD-VOBS) of the fifth node N5 is applied to the second node N2 because the voltage of the fifth node N5 changes from the on-bias stress voltage VOBS to the high-potential drive voltage VDD, and the second node N2 is coupled to the fifth node N5 through the storage capacitor Cst. For example, the voltage of the second node N2, which is the gate electrode of the driving transistor DT, changes to VDD+(VDATA-|Vth|-VOBS). Therefore, the gate-source voltage Vgs of the driving transistor DT can be VDD+(VDATA-|Vth|-VOBS). Further, the fourth transistor T4 is also turned on and defines current paths of the third node N3 and the fourth node N4. As a result, a drive current Ioled, which passes through the source electrode and the drain electrode of the driving transistor DT, is applied to the light-emitting element LD.

A relationship formula related to the drive current Ioled flowing through the light-emitting element LD during the emission period t4 is expressed by Equation 1 below.

$$Ioled = k(Vgs - |Vth|)2 = \quad \text{[Equation 1]}$$
$$k(VDD - VDD + (VDATA - |Vth| - VOBS) - |Vth|)2 =$$
$$k(VOBS - VDATA)2$$

In Equation 1, k represents a proportional factor determined by electron mobility, parasitic capacitance, channel capacity, and the like of the driving transistor DT.

As shown in Equation 1, the both the component of the threshold voltage Vth and the component of the high-potential drive voltage VDD of the driving transistor DT are removed from the relationship formula of the drive current Ioled. This means that in the display device 100 according to the embodiment of the present disclosure, the drive current Ioled is not changed even though the threshold voltage Vth and the high-potential drive voltage VDD are changed. For example, the display device 100 according to the embodiment of the present disclosure can program the data voltage regardless of the amount of change in the threshold voltage Vth and the high-potential drive voltage VDD.

As the area of the display device increases, there occurs a problem in that the high-potential drive voltage is dropped and the luminance is not uniform because of resistance of the line through which the high-potential drive voltage is applied.

Therefore, in the display device 100 according to the embodiment of the present disclosure, the transistor T9 can be disposed between the on-bias stress voltage line, through which the on-bias stress voltage VOBS is supplied, and the fifth node N5, which corresponds to one electrode of the storage capacitor Cst, so that the on-bias stress voltage VOBS can be applied to the fifth node N5 before the emission period t4, and the transistor T8 can be disposed between the fifth node N5 and the high-potential drive voltage line, through which the high-potential drive voltage VDD is supplied, so that the high-potential drive voltage VDD can be applied to the fifth node N5 during the emission period t4. Therefore, in the display device 100 according to the embodiment of the present disclosure, the on-bias stress voltage VOBS is applied to the fifth node N5 before the emission period t4, and the high-potential drive voltage VDD is applied to the fifth node N5 during the emission period t4, such that a drop of the high-potential drive voltage can be minimized, thereby improving the luminance uniformity and display quality of the large-area display device.

In addition, in the display device, the high-potential drive voltage VDD can be compensated by means of a line through which separate power is supplied. However, because the line for supplying the separate power is additionally required, which increases a bezel and causes a disadvantageous design.

Therefore, in the display device 100 according to the embodiment of the present disclosure, the transistor T9 can be disposed between the on-bias stress voltage line, through which the on-bias stress voltage VOBS is supplied, and the fifth node N5, which corresponds to one electrode of the storage capacitor Cst, so that the on-bias stress voltage VOBS can be applied to the fifth node N5 before the emission period t4, and the transistor T8 can be disposed between the fifth node N5 and the high-potential drive voltage line, through which the high-potential drive voltage VDD is supplied, so that the high-potential drive voltage VDD can be applied to the fifth node N5 during the emission period t4. Therefore, in the display device 100 according to the embodiment of the present disclosure, it is possible to compensate for the high-potential drive voltage by applying the on-bias stress voltage VOBS to the fifth node N5 through the on-bias stress voltage line, through which the on-bias stress voltage VOBS is applied, without additionally connecting a line through which separate power can be applied to the fifth node N5 corresponding to one electrode of the storage capacitor Cst. Therefore, it is possible to minimize the bezel and implement an advantageous design of the display device.

Figure 8:
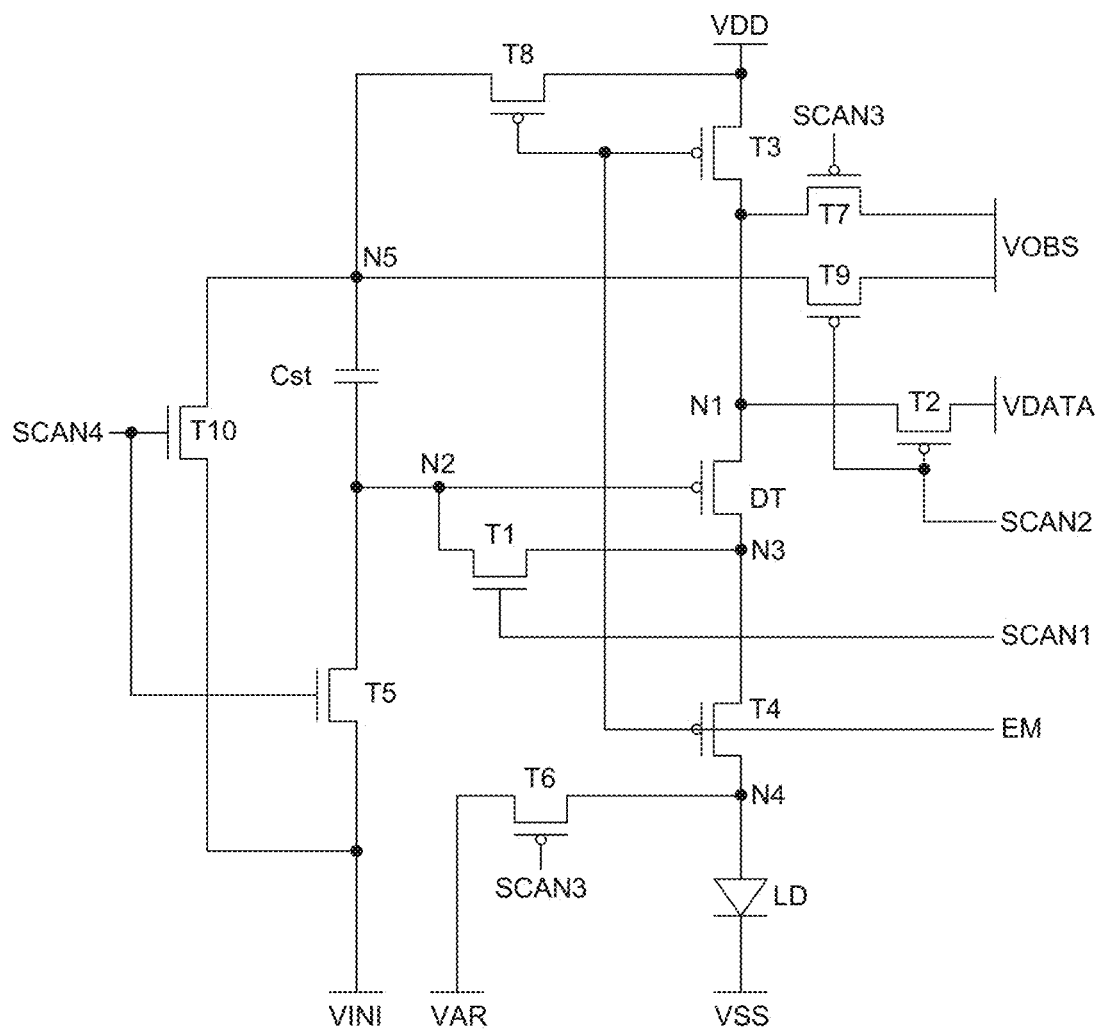
FIG. 8 is an example circuit diagram of a pixel of a display device according to another embodiment of the present disclosure.

FIG. 8 is an example circuit diagram of a pixel of a display device according to another embodiment of the present disclosure. The configuration in FIG. 8 is identical to the configuration in FIG. 2, except for the ninth transistor T9 and a tenth transistor T10. Therefore, repeated descriptions of the identical components will be omitted or may be briefly provided.

With reference to FIG. 8, a pixel PX of a display device 200 according to another embodiment of the present disclosure includes the ninth transistor T9.

The ninth transistor T9 applies the on-bias stress voltage VOBS to the fifth node N5. The ninth transistor T9 can be connected between the fifth node N5 and the fifth power line through which the on-bias stress voltage VOBS is provided. For example, the first electrode (e.g., the source electrode) of the ninth transistor T9 can be connected to the fifth power line, and the second electrode (e.g., the drain electrode) of the ninth transistor T9 can be connected to the fifth node N5. In addition, the gate electrode of the ninth transistor T9 can be connected to the second scan line through which the second scan signal SCAN2 is supplied.

The ninth transistor T9 can be turned on when the second scan signal SCAN2 is supplied to the second scan line. When the ninth transistor T9 is turned on, the fifth node N5 can be electrically connected to the fifth power line, such that the fifth power voltage can be applied to the fifth node N5.

The ninth transistor T9 can be configured as a polysilicon semiconductor transistor. For example, the ninth transistor T9 can include a polysilicon semiconductor layer that is an active layer formed through a low-temperature poly-silicon (LTPS) process. In addition, the ninth transistor T9 can be a P-type transistor (e.g., a PMOS transistor). Therefore, the gate-on voltage for turning on the ninth transistor T9 can be at a low logic level. Because the polysilicon semiconductor transistor advantageously has a high response speed, the polysilicon semiconductor transistor can be applied to a switching element that requires quick switching.

With reference to FIG. 8, the pixel PX of the display device 200 according to another embodiment of the present disclosure further includes the tenth transistor T10.

The tenth transistor T10 applies the first initialization voltage VINI to the fifth node N5 that is the first electrode of the storage capacitor Cst. The tenth transistor T10 can be connected between the fifth node N5 and the third power line through which the first initialization voltage VINI is provided. For example, a first electrode (e.g., a source electrode) of the tenth transistor T10 can be connected to the third power line, and a second electrode (e.g., a drain electrode) of the tenth transistor T10 can be connected to the fifth node N5. In addition, a gate electrode of the tenth transistor T10 can be connected to the fourth scan line through which the fourth scan signal SCAN4 is supplied. When the fourth scan signal SCAN4 is supplied to the fourth scan line, the tenth transistor T10 can be turned on and supply the first initialization voltage VINI to the fifth node N5. In this case, the first initialization voltage VINI can be set to a voltage lower than the lowest level of the data voltage VDATA supplied to the data line DL.

Meanwhile, the tenth transistor T10 can be configured as an oxide semiconductor transistor. For example, the tenth transistor T10 can be an N-type oxide semiconductor transistor (e.g., an NMOS transistor) and include an oxide semiconductor layer as an active layer. Therefore, the gate-on voltage for turning on the tenth transistor T10 can be at the high logic level.

Therefore, when the fourth scan signal SCAN4 at the high level is supplied, the fifth transistor T5 can be turned on, such that the first initialization voltage VINI can be applied to the second node N2. In addition, the tenth transistor T10 can be turned on, such that the first initialization voltage VINI can be applied to the fifth node N5. For example, when the fourth scan signal SCAN4 at the high level is supplied, the fifth transistor T5 and the tenth transistor T10 can be turned on, such that both the first electrode and the second electrode of the storage capacitor Cst can be initialized to the first initialization voltage VINI.

Figure 9:
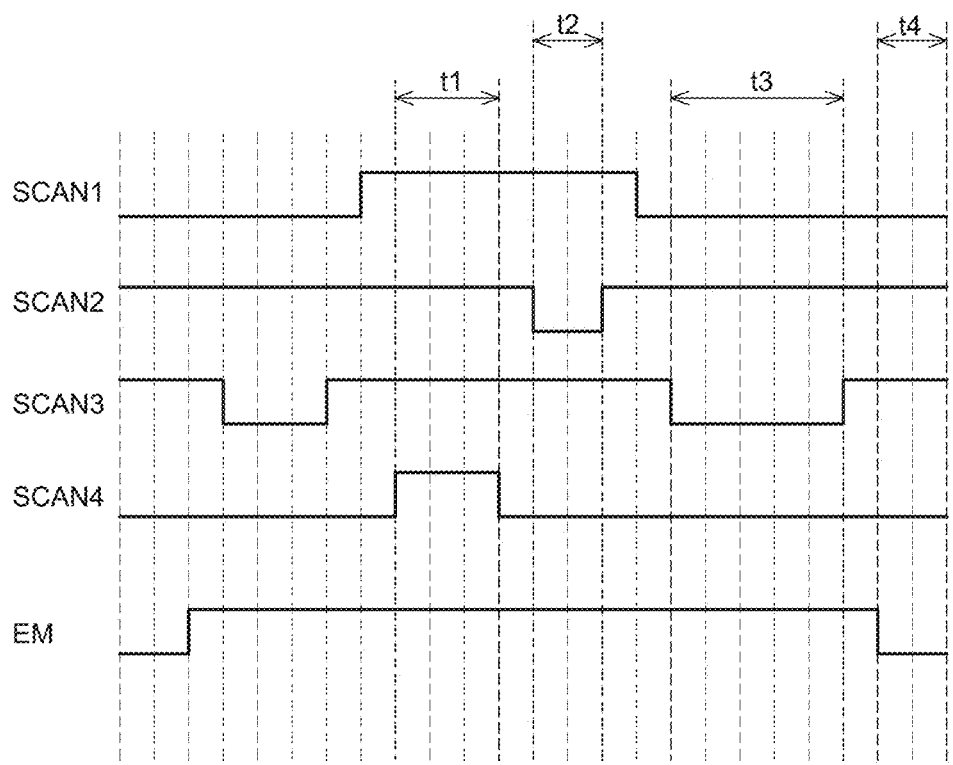
FIG. 9 is a waveform diagram illustrating a light emission signal and a scan signal of the display device according to another embodiment of the present disclosure during a refresh frame.
Figure 10:
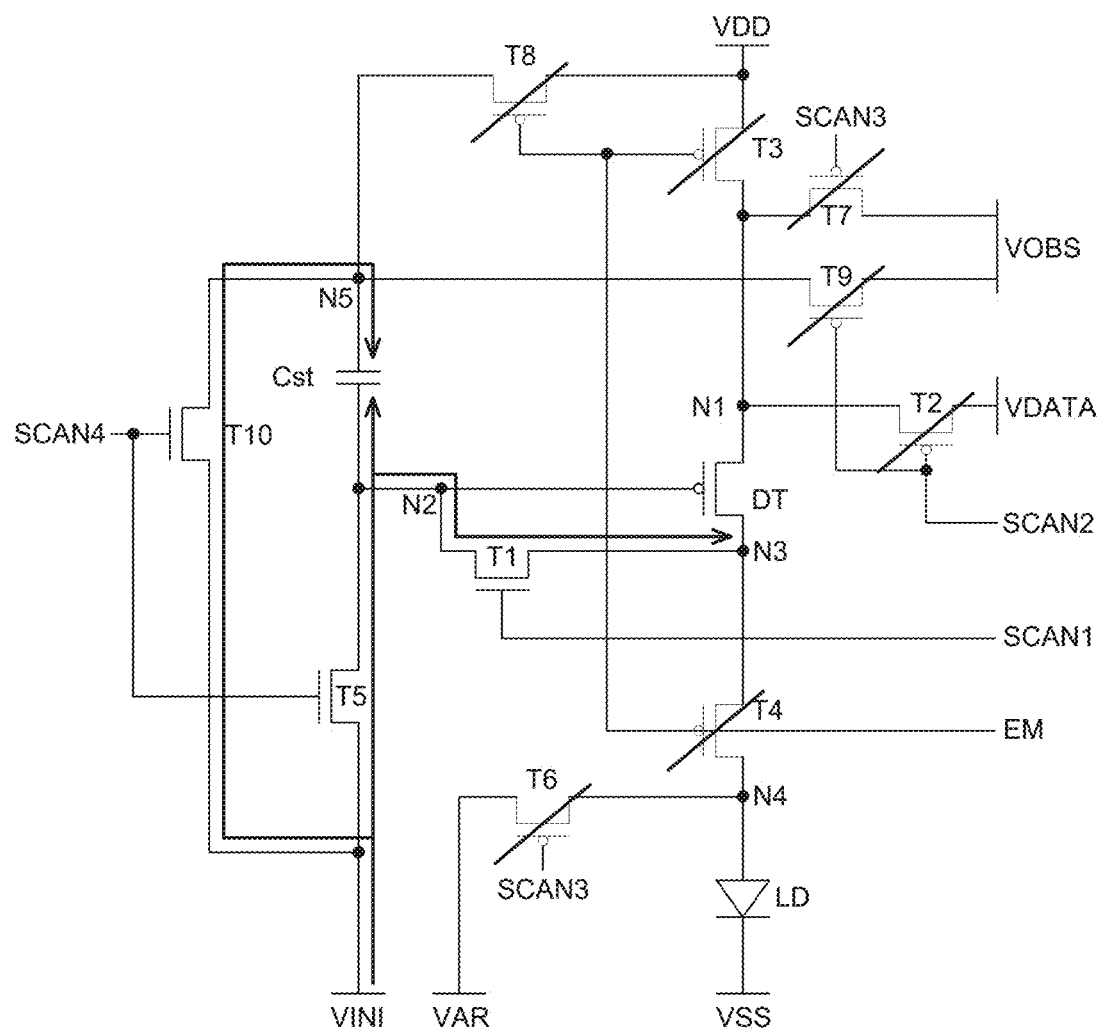
FIG. 10 is a circuit diagram illustrating an operation of a pixel circuit of the display device according to another embodiment of the present disclosure during a first period.
Figure 11:
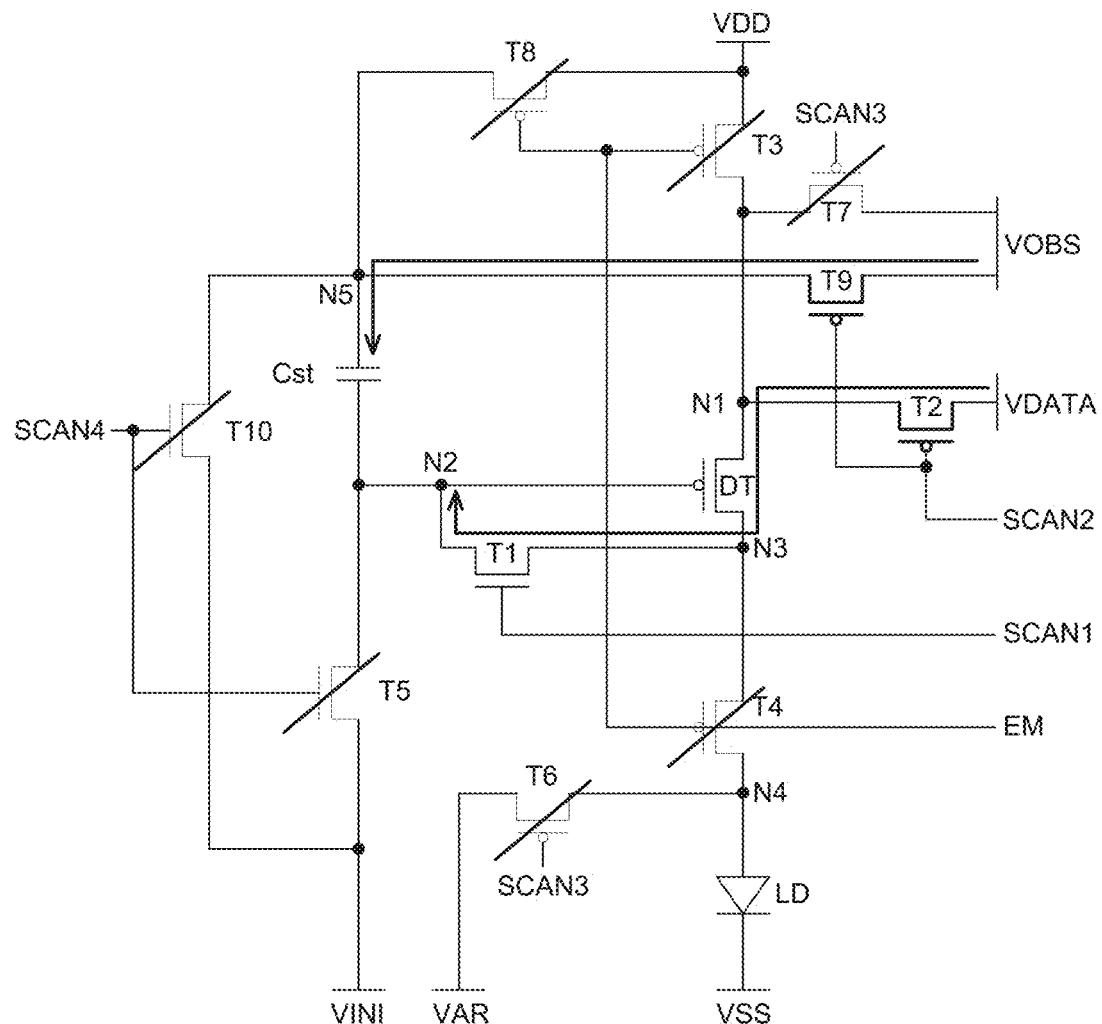
FIG. 11 is a circuit diagram illustrating an operation of the pixel circuit of the display device according to another embodiment of the present disclosure during a second period.
Figure 12:
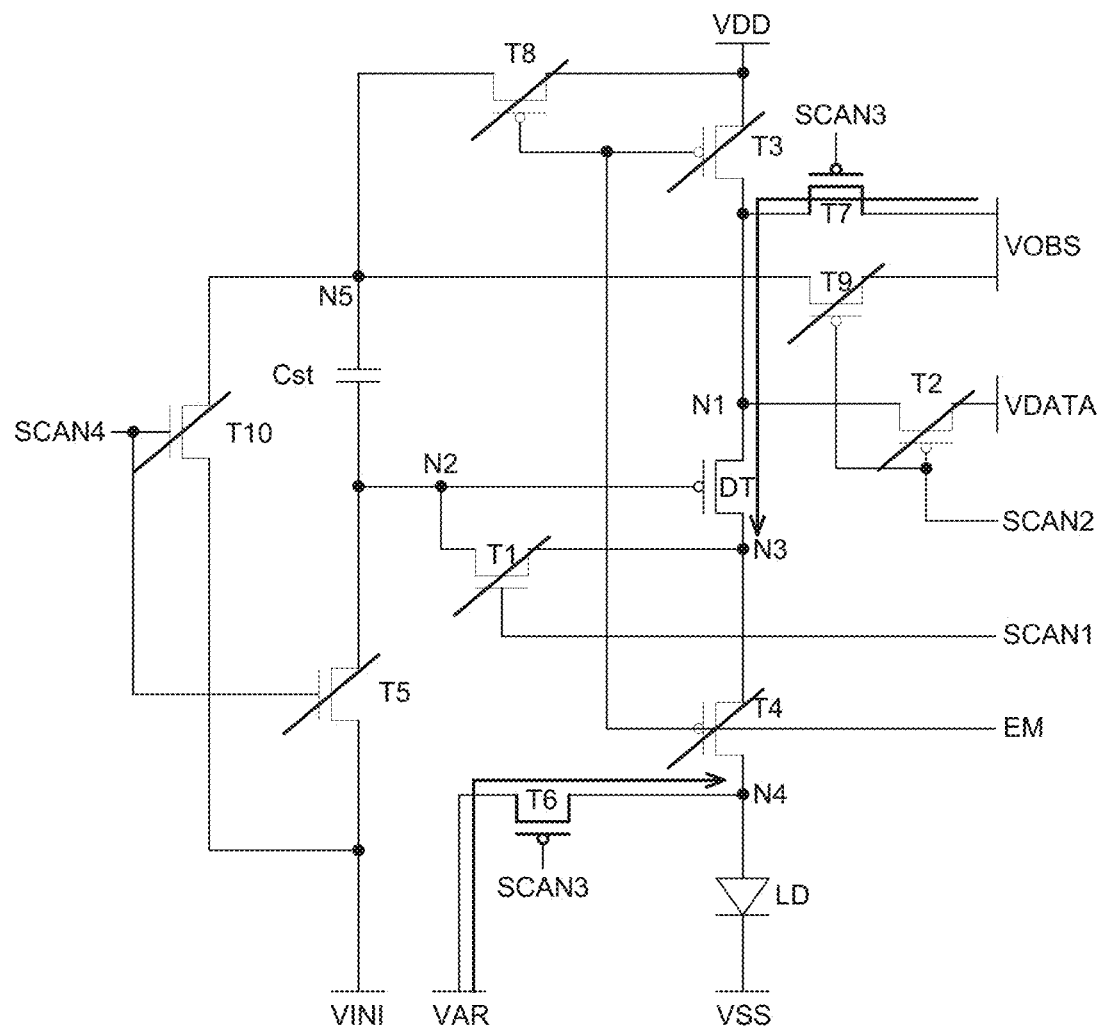
FIG. 12 is a circuit diagram illustrating an operation of the pixel circuit of the display device according to another embodiment of the present disclosure during a third period.
Figure 13:
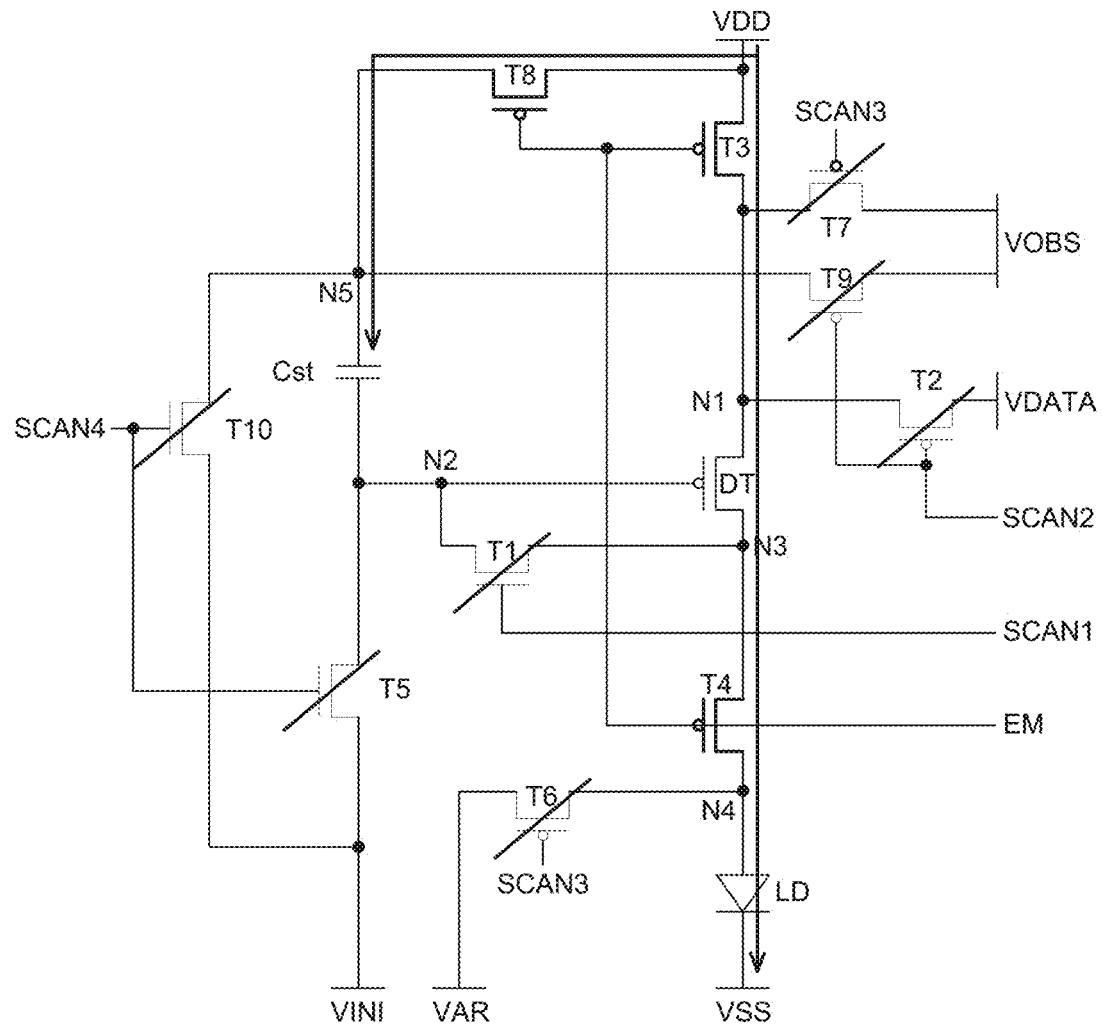
FIG. 13 is a circuit diagram illustrating an operation of the pixel circuit of the display device according to another embodiment of the present disclosure during a fourth period.

FIG. 9 is a waveform diagram illustrating a light emission signal and a scan signal of the display device according to another embodiment of the present disclosure during a refresh frame. FIG. 10 is a circuit diagram illustrating an operation of a pixel circuit of the display device according to another embodiment of the present disclosure during a first period. FIG. 11 is a circuit diagram illustrating an operation of the pixel circuit of the display device according to another embodiment of the present disclosure during a second period. FIG. 12 is a circuit diagram illustrating an operation of the pixel circuit of the display device according to another embodiment of the present disclosure during a third period. FIG. 13 is a circuit diagram illustrating an operation of the pixel circuit of the display device according to another embodiment of the present disclosure during a fourth period.

With reference to FIGS. 9 and 10, the first scan signal SCAN1 and the fourth scan signal SCAN4 are at high levels during the initial period t1. Therefore, the first transistor T1, the fifth transistor T5, and the tenth transistor T10 are turned on, such that the first initialization voltage VINI is applied to the second node N2 and the fifth node N5. As a result, the gate electrode and the drain electrode of the driving transistor DT are initialized to the first initialization voltage VINI, and the first electrode and the second electrode of the storage capacitor Cst can also be initialized to the first initialization voltage VINI.

In addition, the second transistor T2, the third transistor T3, the fourth transistor T4, the sixth transistor T6, the seventh transistor T7, the eighth transistor T8, and the ninth transistor T9 are turned off during the initial period t1 because the second scan signal SCAN2, the third scan signal SCAN3, and the fourth scan signal SCAN4 are at the high level.

With reference to FIGS. 9 and 11, during the sampling period t2, the first scan signal SCAN1 is at the high level, i.e., the turn-on level, and the second scan signal SCAN2 is at the low level, i.e., the turn-on level. Therefore, the second transistor T2 is turned on, such that the data voltage VDATA is applied to the first node N1. Further, as the first transistor T1 is also turned on, the driving transistor DT is diode-connected, and the gate electrode and the drain electrode of the driving transistor DT are short-circuited, such that the driving transistor DT operates like a diode. Further, the ninth transistor T9 is also turned on, such that the on-bias stress voltage VOBS is applied to the fifth node N5.

In addition, the third transistor T3, the fourth transistor T4, the fifth transistor T5, the sixth transistor T6, the seventh transistor T7, the eighth transistor T8, and the tenth transistor T10 are turned off during the sampling period t2 because the third scan signal SCAN3 is at the high level, i.e., the turn-off level, and the fourth scan signal SCAN4 is at the low level, i.e., the turn-off level.

The current Ids flows between the source and the drain of the driving transistor DT during the sampling period t2. Because the gate electrode and the drain electrode of the driving transistor DT are in the diode-connected state, the voltage of the second node N2 is increased by the current flowing from the source electrode to the drain electrode until a gate-source voltage Vgs of the driving transistor DT becomes equal to the threshold voltage Vth. During the sampling period t2, the voltage of the second node N2 is charged as a voltage (VDATA−|Vth|) corresponding to a value made by subtracting the threshold voltage Vth of the driving transistor DT from the data voltage VDATA.

With reference to FIGS. 9 and 12, during the on-bias stress period t3, the third scan signal SCAN3 is at the low level, i.e., the turn-on level. Therefore, the sixth transistor T6 is turned on, such that the second initialization voltage VAR is applied to the fourth node N4. For example, the anode electrode of the light-emitting element LD is initialized to the second initialization voltage VAR.

Further, the seventh transistor T7 is turned on, such that the on-bias stress voltage VOBS is applied to the first node N1. For example, the gate-source voltage Vgs of the driving transistor DT can be decreased by applying bias stress to the first node N1, which is the source electrode of the driving transistor DT, during the on-bias stress period t3. Therefore, the source-drain current Ids of the driving transistor DT flows during the on-bias stress period t3, which can mitigate the hysteresis of the driving transistor DT.

In addition, the first transistor T1, the second transistor T2, the third transistor T3, the fourth transistor T4, the fifth transistor T5, the eighth transistor T8, the ninth transistor T9, and the tenth transistor T10 are turned off during the on-bias stress period t3 because the first scan signal SCAN1 is at the low level, i.e., the turn-off level, the second scan signal SCAN2 is at the high level, i.e., the turn-off level, and the fourth scan signal SCAN4 is at the low level, i.e., the turn-off level.

During the on-bias stress period t3, the first transistor T1 is turned off, such that the voltage of the second node N2 floats in a state of a voltage (VDATA−|Vth|) corresponding to a value made by subtracting the threshold voltage Vth of the driving transistor DT from the data voltage VDATA. In addition, the ninth transistor T9 is turned off, such that the voltage of the fifth node N5 floats in the state in which the on-bias stress voltage VOBS is applied.

With reference to FIGS. 9 and 13, during the emission period t4, the light emission signal EM is at the low level, i.e., the turn-on level. Therefore, the third transistor T3 is turned on, such that the first power voltage VDD, which is a high-potential drive voltage, is applied to the first node N1. Further, the eighth transistor T8 is turned on, such that the first power voltage VDD is applied to the fifth node N5. For example, the voltage of the fifth node N5 changes from the on-bias stress voltage VOBS to the high-potential drive voltage VDD.

In addition, the first transistor T1, the second transistor T2, the fifth transistor T5, the sixth transistor T6, the seventh transistor T7, the ninth transistor T9, and the tenth transistor T10 are turned off during the emission period t4 because the first scan signal SCAN1 is at the low level, i.e., the turn-off level, the second scan signal SCAN2 is at the high level, i.e., the turn-off level, the third scan signal SCAN3 is at the high level, i.e., the turn-off level, and the fourth scan signal SCAN4 is at the low level, i.e., the turn-off level.

During the emission period t4, the amount of change in voltage (VDD-VOBS) of the fifth node N5 is applied to the second node N2 because the voltage of the fifth node N5 changes from the on-bias stress voltage VOBS to the high-potential drive voltage VDD, and the second node N2 is coupled to the fifth node N5 through the storage capacitor Cst. For example, the voltage of the second node N2, which is the gate electrode of the driving transistor DT, changes to VDD+(VDATA−|Vth|−VOBS). Therefore, the gate-source voltage Vgs of the driving transistor DT can be VDD+(VDATA−|Vth|−VOBS). Further, the fourth transistor T4 is also turned on and defines current paths of the third node N3 and the fourth node N4. As a result, a drive current Ioled, which passes through the source electrode and the drain electrode of the driving transistor DT, is applied to the light-emitting element LD.

A relationship formula related to the drive current Ioled flowing through the light-emitting element LD during the emission period t4 is expressed by Equation 1 below.

$$Ioled = k(Vgs - |Vth|)2 = \qquad\qquad \text{[Equation 1]}$$
$$k(VDD - VDD + (VDATA - |Vth| - VOBS) - |Vth|)^2 =$$
$$k(VOBS - VDATA)^2$$

In Equation 1, k represents a proportional factor determined by electron mobility, parasitic capacitance, channel capacity, and the like of the driving transistor DT.

As shown in Equation 1, the both the component of the threshold voltage Vth and the component of the high-potential drive voltage VDD of the driving transistor DT are removed from the relationship formula of the drive current Ioled. This means that in the display device 200 according to the embodiment of the present disclosure, the drive current Ioled is not changed even though the threshold voltage Vth and the high-potential drive voltage VDD are changed. For example, the display device 200 according to the embodiment of the present disclosure can program the data voltage regardless of the amount of change in the threshold voltage Vth and the high-potential drive voltage VDD.

Therefore, in the display device 200 according to another embodiment of the present disclosure, the on-bias stress voltage VOBS is applied to the fifth node N5 before the emission period t4, and the high-potential drive voltage VDD is applied to the fifth node N5 during the emission period t4, such that a drop of the high-potential drive voltage can be minimized, thereby improving the luminance uniformity and display quality of the large-area display device.

In addition, in the display device 200 according to another embodiment of the present disclosure, it is possible to compensate for the high-potential drive voltage by applying the on-bias stress voltage VOBS to the fifth node N5 through the on-bias stress voltage line, through which the on-bias stress voltage VOBS is applied, without additionally connecting a line through which separate power can be applied to the fifth node N5 corresponding to one electrode of the storage capacitor Cst. Therefore, it is possible to minimize the bezel and implement an advantageous design of the display device.

Further, in the display device 200 according to another embodiment of the present disclosure, the tenth transistor T10 can be disposed between the fifth node N5, which corresponds to the first electrode of the storage capacitor Cst, and the first initialization voltage line, through which the first initialization voltage VINI is supplied, and the first initialization voltage VINI can be applied to the fifth node N5, which corresponds to the first electrode of the storage capacitor Cst, and the second node N2, which corresponds to the second electrode of the storage capacitor Cst, during the initial period t1, such that both the two opposite ends of the storage capacitor Cst can be initialized. Therefore, in the display device 200 according to another embodiment of the present disclosure, both the first and second electrodes of the storage capacitor Cst can be initialized during the initial period t1. Therefore, it is possible to improve the reliability of the internal compensation in comparison with a case in which only one electrode of the storage capacitor Cst is initialized.

A display device according to the example embodiments of the present disclosure can also be described as follows:

A display device according to an example embodiment of the present disclosure includes a display panel on which a plurality of pixels is disposed, the plurality of pixels each includes a light-emitting element configured to emit light by a drive current, a driving transistor disposed between a first node and a third node and configured to control the drive current flowing, through the light-emitting element, from a first power line, through which a first power voltage is provided, to a second power line through which a second power voltage is provided, a first transistor connected between the third node and a second node, a second transistor connected between a data line and the first node and configured to apply a data voltage to the first node, a third transistor connected between the first power line and the first node and configured to apply the first power voltage to the first node, a fourth transistor connected between the third node and a first electrode of the light-emitting element and configured to define a current path between the driving transistor and the light-emitting element, a fifth transistor connected between the second node and a third power line, through which a third power voltage is provided, and configured to apply the third power voltage to the second node, a sixth transistor connected between a fourth node and a fourth power line, through which a fourth power voltage is provided, and configured to apply the fourth power voltage to the fourth node, a seventh transistor connected between the first node and a fifth power line, through which a fifth power voltage is provided, and configured to apply the fifth power voltage to the first node and a storage capacitor having a first electrode connected to the second node, and a second electrode connected to a fifth node, and wherein the fifth node is connected to the first power line and the fifth power line so that the first power voltage or the fifth power voltage is applied to the fifth node.

The display device can further include an eighth transistor connected between the first power line and the fifth node and configured to apply the first power voltage to the fifth node and a ninth transistor connected between the fifth node and the fifth power line and configured to apply the fifth power voltage to the fifth node.

The fifth power voltage can be a constant voltage and equal to or higher than the first power voltage.

The first transistor, the fifth transistor, and the ninth transistor can be n-type oxide transistors, and the driving transistor, the second transistor, the third transistor, the fourth transistor, the sixth transistor, the seventh transistor, and the eighth transistor can be P-type low-temperature polycrystalline silicon (LTPS) transistors.

The display device can operate with frames divided into a refresh frame during which the data voltage is applied to the plurality of pixels, and a reset frame during which an anode of the light-emitting element is reset, the refresh frame can be divided into a first period, a second period, a third period, and a fourth period, the third power voltage can be applied to the second node or the third node, and the fifth power voltage can be applied to the fifth node during the first period, the second node can be charged with a voltage corresponding to the data voltage and a threshold voltage Vth of the driving transistor, and the fifth power voltage can be applied to the fifth node during the second period, the fifth power voltage can be applied to the first node during the third period, and the drive current can be applied to the light-emitting element, and the light-emitting element emits light during the fourth period.

A voltage of the second node can be a voltage made by adding the first power voltage to a voltage made by subtracting the fifth power voltage and the threshold voltage of the driving transistor from the data voltage during the fourth period, and a voltage of the fifth node can be a first power voltage during the fourth period.

The driving transistor can include a first electrode connected to the first node, a second electrode connected to the third node and a gate electrode connected to the second node, the first transistor can include a first electrode connected to the second node, a second electrode connected to the third node and a gate electrode connected to a first scan line configured to supply a first scan signal, the second transistor can include a first electrode connected to the data line, a second electrode connected to the first node and a gate electrode connected to a second scan line configured to supply a second scan signal, the third transistor can include a first electrode connected to the first power line, a second electrode connected to the first node and a gate electrode connected to a light-emitting line configured to supply a light emission signal, the fourth transistor can include a first electrode connected to the third node, a second electrode connected to the fourth node and a gate electrode connected to the light-emitting line, the fifth transistor can include a first electrode connected to the third power line, a second electrode connected to the second node and a gate electrode connected to a fourth scan line configured to supply a fourth scan signal, the sixth transistor can include a first electrode connected to the fourth power line, a second electrode connected to the fourth node and a gate electrode connected to a third scan line configured to supply a third scan signal, the seventh transistor can include a first electrode connected to the fifth power line, a second electrode connected to the first node and a gate electrode connected to the third scan line, the eighth transistor can include a first electrode connected to the first power line, a second electrode connected to the fifth node and a gate electrode connected to the light-emitting line, and the ninth transistor can include a first electrode connected to the fifth power line, a second electrode connected to the fifth node and a gate electrode connected to the first scan line.

The display device can further include a tenth transistor connected between the third power line and the fifth node and configured to apply the third power voltage to the fifth node.

The first transistor, the fifth transistor, and the tenth transistor can be n-type oxide transistors, and the driving transistor, the second transistor, the third transistor, the fourth transistor, the sixth transistor, the seventh transistor, the eighth transistor, and the ninth transistor can be P-type low-temperature polycrystalline silicon (LTPS) transistors.

The display device can operate with frames divided into a refresh frame during which the data voltage is applied to the plurality of pixels, and a reset frame during which an anode of the light-emitting element is reset, the refresh frame can be divided into a first period, a second period, a third period, and a fourth period, the third power voltage can be applied to the second node, the third node, or the fifth node during the first period, the second node can be charged with a voltage corresponding to the data voltage and a threshold voltage Vth of the driving transistor, and the fifth power voltage is applied to the fifth node during the second period, the fifth power voltage can be applied to the first node during the third period, and the drive current can be applied to the light-emitting element, and the light-emitting element emits light during the fourth period.

The driving transistor can include a first electrode connected to the first node, a second electrode connected to the third node and a gate electrode connected to the second node, the first transistor can include a first electrode connected to the second node, a second electrode connected to the third node and a gate electrode connected to a first scan line configured to supply a first scan signal, the second transistor can include a first electrode connected to the data line, a second electrode connected to the first node and a gate electrode connected to a second scan line configured to supply a second scan signal, the third transistor can include a first electrode connected to the first power line, a second electrode connected to the first node and a gate electrode connected to a light-emitting line configured to supply a light emission signal, the fourth transistor can include a first electrode connected to the third node, a second electrode connected to the fourth node and a gate electrode connected to the light-emitting line, the fifth transistor can include a first electrode connected to the third power line, a second electrode connected to the second node and a gate electrode connected to a fourth scan line configured to supply a fourth scan signal, the sixth transistor can include a first electrode connected to the fourth power line, a second electrode connected to the fourth node and a gate electrode connected to a third scan line configured to supply a third scan signal, the seventh transistor can include a first electrode connected to the fifth power line, a second electrode connected to the first node and a gate electrode connected to the third scan line, the eighth transistor can include a first electrode connected to the first power line, a second electrode connected to the fifth node and a gate electrode connected to the light-emitting line, the ninth transistor can include a first electrode connected to the fifth power line, a second electrode connected to the fifth node and a gate electrode connected to the second scan line, and the tenth transistor can include a first electrode connected to the third power line, a second electrode connected to the fifth node and a gate electrode connected to the fourth scan line.

Although the example embodiments of the present disclosure have been described in detail with reference to the accompanying drawings, the present disclosure is not limited thereto and can be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto. Therefore, it should be understood that the above-described example embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:
1. A display device comprising:
a display panel having a plurality of pixels disposed therein,
wherein each of the plurality of pixels comprises:
a light-emitting element configured to emit light by a drive current;
a driving transistor disposed between a first node and a third node and configured to control the drive current flowing through the light-emitting element, from a first power line through which a first power voltage is provided to a second power line through which a second power voltage is provided;
a first transistor connected between the third node and a second node;
a second transistor connected between a data line and the first node and configured to apply a data voltage to the first node;
a third transistor connected between the first power line and the first node and configured to apply the first power voltage to the first node;
a fourth transistor connected between the third node and a first electrode of the light-emitting element, and configured to define a current path between the driving transistor and the light-emitting element;
a fifth transistor connected between the second node and a third power line through which a third power voltage is provided, and configured to apply the third power voltage to the second node;
a sixth transistor connected between a fourth node and a fourth power line through which a fourth power voltage is provided, and configured to apply the fourth power voltage to the fourth node;
a seventh transistor connected between the first node and a fifth power line through which a fifth power voltage is provided, and configured to apply the fifth power voltage to the first node; and
a storage capacitor having a first electrode connected to the second node, and a second electrode connected to a fifth node, and
wherein the fifth node is connected to the first power line and the fifth power line so that the first power voltage or the fifth power voltage is applied to the fifth node.

2. The display device of claim 1, further comprising:
an eighth transistor connected between the first power line and the fifth node and configured to apply the first power voltage to the fifth node; and a ninth transistor connected between the fifth node and the fifth power line and configured to apply the fifth power voltage to the fifth node.

3. The display device of claim 2, wherein the first transistor, the fifth transistor, and the ninth transistor are n-type oxide transistors, and
wherein the driving transistor, the second transistor, the third transistor, the fourth transistor, the sixth transistor, the seventh transistor, and the eighth transistor are P-type low-temperature polycrystalline silicon (LTPS) transistors.

4. The display device of claim 2, wherein the driving transistor comprises:
a first electrode connected to the first node;
a second electrode connected to the third node; and
a gate electrode connected to the second node,
wherein the first transistor comprises:
a first electrode connected to the second node;
a second electrode connected to the third node; and
a gate electrode connected to a first scan line configured to supply a first scan signal,
wherein the second transistor comprises:
a first electrode connected to the data line;
a second electrode connected to the first node; and
a gate electrode connected to a second scan line configured to supply a second scan signal,
wherein the third transistor comprises:
a first electrode connected to the first power line;
a second electrode connected to the first node; and
a gate electrode connected to a light-emitting line configured to supply a light emission signal,
wherein the fourth transistor comprises:
a first electrode connected to the third node;
a second electrode connected to the fourth node; and
a gate electrode connected to the light-emitting line,
wherein the fifth transistor comprises:
a first electrode connected to the third power line;
a second electrode connected to the second node; and
a gate electrode connected to a fourth scan line configured to supply a fourth scan signal,
wherein the sixth transistor comprises:
a first electrode connected to the fourth power line;
a second electrode connected to the fourth node; and
a gate electrode connected to a third scan line configured to supply a third scan signal,
wherein the seventh transistor comprises:
a first electrode connected to the fifth power line;
a second electrode connected to the first node; and
a gate electrode connected to the third scan line,
wherein the eighth transistor comprises:
a first electrode connected to the first power line;
a second electrode connected to the fifth node; and
a gate electrode connected to the light-emitting line, and
wherein the ninth transistor comprises:
a first electrode connected to the fifth power line;
a second electrode connected to the fifth node; and
a gate electrode connected to the first scan line.

5. The display device of claim 2, further comprising:
a tenth transistor connected between the third power line and the fifth node and configured to apply the third power voltage to the fifth node.

6. The display device of claim 5, wherein the first transistor, the fifth transistor, and the tenth transistor are n-type oxide transistors, and
wherein the driving transistor, the second transistor, the third transistor, the fourth transistor, the sixth transistor, the seventh transistor, the eighth transistor, and the ninth transistor are P-type low-temperature polycrystalline silicon (LTPS) transistors.

7. The display device of claim 6, wherein the display device operates with frames divided into a refresh frame during which the data voltage is applied to the plurality of pixels, and a reset frame during which an anode of the light-emitting element is reset,
wherein the refresh frame is divided into a first period, a second period, a third period, and a fourth period,
wherein the third power voltage is applied to the second node, the third node, or the fifth node during the first period,
wherein the second node is charged with a voltage corresponding to the data voltage and a threshold voltage Vth of the driving transistor, and the fifth power voltage is applied to the fifth node during the second period,
wherein the fifth power voltage is applied to the first node during the third period, and
wherein the drive current is applied to the light-emitting element, and the light-emitting element emits light during the fourth period.

8. The display device of claim 5, wherein the driving transistor comprises:
a first electrode connected to the first node;
a second electrode connected to the third node; and
a gate electrode connected to the second node,
wherein the first transistor comprises:
a first electrode connected to the second node;
a second electrode connected to the third node; and
a gate electrode connected to a first scan line configured to supply a first scan signal,
wherein the second transistor comprises:
a first electrode connected to the data line;
a second electrode connected to the first node; and
a gate electrode connected to a second scan line configured to supply a second scan signal,
wherein the third transistor comprises:
a first electrode connected to the first power line;
a second electrode connected to the first node; and
a gate electrode connected to a light-emitting line configured to supply a light emission signal,
wherein the fourth transistor comprises:
a first electrode connected to the third node;
a second electrode connected to the fourth node; and
a gate electrode connected to the light-emitting line,
wherein the fifth transistor comprises:
a first electrode connected to the third power line;
a second electrode connected to the second node; and
a gate electrode connected to a fourth scan line configured to supply a fourth scan signal,
wherein the sixth transistor comprises:
a first electrode connected to the fourth power line;
a second electrode connected to the fourth node; and
a gate electrode connected to a third scan line configured to supply a third scan signal,
wherein the seventh transistor comprises:
a first electrode connected to the fifth power line;
a second electrode connected to the first node; and
a gate electrode connected to the third scan line,
wherein the eighth transistor comprises:
a first electrode connected to the first power line;
a second electrode connected to the fifth node; and
a gate electrode connected to the light-emitting line,
wherein the ninth transistor comprises:
a first electrode connected to the fifth power line;
a second electrode connected to the fifth node; and
a gate electrode connected to the second scan line, and wherein the tenth transistor comprises:
a first electrode connected to the third power line;
a second electrode connected to the fifth node; and
a gate electrode connected to the fourth scan line.

9. The display device of claim 1, wherein the fifth power voltage is a constant voltage and equal to or higher than the first power voltage.

10. The display device of claim 9, wherein the display device operates with frames divided into a refresh frame during which the data voltage is applied to the plurality of pixels, and a reset frame during which an anode of the light-emitting element is reset,
wherein the refresh frame is divided into a first period, a second period, a third period, and a fourth period,
wherein the third power voltage is applied to the second node or the third node, and the fifth power voltage is applied to the fifth node during the first period,
wherein the second node is charged with a voltage corresponding to the data voltage and a threshold voltage Vth of the driving transistor, and the fifth power voltage is applied to the fifth node during the second period,
wherein the fifth power voltage is applied to the first node during the third period, and
wherein the drive current is applied to the light-emitting element, and the light-emitting element emits light during the fourth period.

11. The display device of claim 10, wherein a voltage of the second node is a voltage made by adding the first power voltage to a voltage made by subtracting the fifth power voltage and the threshold voltage of the driving transistor from the data voltage during the fourth period, and
wherein a voltage of the fifth node is a first power voltage during the fourth period.

* * * * *